(12) United States Patent
Asaumi et al.

(10) Patent No.: US 7,755,157 B2
(45) Date of Patent: Jul. 13, 2010

(54) PHOTOVOLTAIC DEVICE AND MANUFACTURING METHOD OF PHOTOVOLTAIC DEVICE

(75) Inventors: Toshio Asaumi, Kobe (JP); Toshiaki Baba, Kobe (JP); Akira Terakawa, Nara (JP); Yasufumi Tsunomura, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 51 days.

(21) Appl. No.: 11/389,171

(22) Filed: Mar. 27, 2006

(65) Prior Publication Data

US 2006/0219292 A1    Oct. 5, 2006

(30) Foreign Application Priority Data

Mar. 29, 2005  (JP)  ............................. 2005-094640
Mar. 31, 2005  (JP)  ............................. 2005-100446
Feb. 14, 2006  (JP)  ............................. 2006-036005

(51) Int. Cl.
*H01L 31/105*   (2006.01)

(52) U.S. Cl. ...................... 257/458; 257/431; 257/444; 257/461

(58) Field of Classification Search ...................... None
See application file for complete search history.

(56) References Cited

U.S. PATENT DOCUMENTS

2002/0069911  A1 *  6/2002  Nakamura et al. .......... 136/243

FOREIGN PATENT DOCUMENTS

| JP | 06163957 A  * | 6/1994 |
| JP | 7-106619 | 4/1995 |
| JP | 2001-274441 | 10/2001 |

* cited by examiner

*Primary Examiner*—Michael B Shingleton
(74) *Attorney, Agent, or Firm*—NDQ&M Watchstone LLP

(57) ABSTRACT

Solar cells and methods of their manufacture are described that exhibit decreased or eliminated leak current, improved open voltage and improved fill factor characteristics. In an embodiment, a separate processed surface is interposed between a first and a second main surface of a crystal substrate, as prepared by laser irradiation and cut processing. The laser irradiation is applied to an amorphous semiconductor layer of the same conductive type as an underlying single crystal substrate, but does not penetrate an underlying amorphous opposite type layer. Details of lamination and laser characteristics for processing the layers are provided.

15 Claims, 13 Drawing Sheets

AVERAGE LENGTH FROM THE OTHER SURFACE TO TOP OF CONVEX PORTIONS / THICKNESS OF SUBSTRATE

PHOTOVOLTAIC DEVICE AND MANUFACTURING METHOD OF PHOTOVOLTAIC DEVICE

BACKGROUND OF THE INVENTION

1. Field of the Invention

The present invention relates to a photovoltaic device including a crystalline semiconductor substrate of first conductive type having a first main surface and a second main surface, and a semiconductor layer of second conductive type formed on the first main surface of the crystalline semiconductor substrate, and relates to a manufacturing method of the photovoltaic device.

2. Description of the Related Art

There is a growing demand for photovoltaic devices in various sizes to meet the needs of consumers in recent years. As a method of manufacturing photovoltaic devices in various sizes, there is a method where photovoltaic devices are formed by use of a substrate in a standard size and then are separated into a desired size.

For example, Japanese Unexamined Patent Publication No. 2001-274441 discloses a method of separating a glass substrate into photovoltaic device. According to the method, photovoltaic devices made of a glass substrate formed by transparent electrodes, amorphous silicon films, and metal electrodes thereon are subjected to irradiation of a laser beam. The laser beam is irradiated onto positions to be separated, from the metal electrode side. Thus, trenches are formed at the positions from which the metal electrodes, the amorphous silicon films, and the transparent electrodes are removed. And then, the glass substrate is cut along the trenches into the photovoltaic devices of a desired size.

Meanwhile, studies and practical applications of solar batteries serving as photovoltaic devices, which are made of crystalline silicon such as single-crystal silicon or polycrystalline silicon have been actively pursued in recent years. Among them, a solar battery having a heterojunction that is formed by combining an amorphous silicon and a crystalline silicon attracts much attention due to its capabilities to obtain the heterojunction in a low-temperature process equal to or below 200° C. and to obtain high conversion efficiency.

FIG. 1 is a schematic cross-sectional view for explaining an example of such a solar battery having a heterojunction that is formed by combining an amorphous silicon and a crystalline silicon. A solar battery 50 has a structure in which an intrinsic amorphous semiconductor layer 3, a p-type amorphous semiconductor layer 4, a p-side transparent conductive film layer 5, and a p-side collector electrode 6 are formed on one main surface of an n-type crystalline semiconductor substrate 2 in the stated order. Moreover, an intrinsic amorphous semiconductor layer 7, an n-type amorphous semiconductor layer 8, an n-side transparent conductive film layer 9, and an n-side collector electrode 10 are formed on the other main surface of the n-type crystalline semiconductor substrate 2 in the stated order.

As described above, in the case of manufacturing the photovoltaic devices in the desired size having a heterojunction formed by combining an amorphous silicon and a crystalline silicon, the process is firstly to form trenches at the portion where the separation process will be performed by removing the collector electrodes, the amorphous semiconductor layers and the intrinsic amorphous semiconductor layers, and then to separate the photovoltaic devices along the trenches. However, the process according to above described disclosure may lead to reductions in the open voltage Voc and the fill factor F. F. from time to time.

SUMMARY OF THE INVENTION

According to an aspect of the present, a photovoltaic device has a crystalline semiconductor substrate of first conductive type including a first main surface and a second main surface provided on opposite side of the first main surface, and a semiconductor layer of second conductive type provided on the first main surface. The crystalline semiconductor substrate includes a separate processed side surface formed by separating process, interposed between the first main surface and the second main surface. The separate processed side surface includes a laser processed region formed by laser process and a cut processed region formed by cutting process. The laser processed region is a region extending from the second main surface toward the first main surface side without reaching the semiconductor layer of second conductive type.

According to the above-described aspect, since the laser processed region is a region extending from the second main surface toward the first main surface side without reaching the semiconductor layer of second conductive type, it is possible to prevent a generation of microcrystal by heat stress of laser beam, in the semiconductor layer of second conductive type. As a result, it is possible to prevent a leak of current via microcrystal, and a deterioration of open voltage Voc and fill factor F. F.

According to an aspect of the present, the semiconductor layer of second conductive type has a structure that an amorphous semiconductor layer of the second conductive type and a conductive film layer of the second conductive type are laminated in order from the first main surface of the crystalline semiconductor substrate.

According to an aspect of the present, the photovoltaic device includes a semiconductor layer of the first conductive type provided on the second main surface of the crystalline semiconductor substrate. The semiconductor layer of the first conductive type has a structure that an amorphous semiconductor layer of the first conductive type and a conductive film layer of the first conductive type are laminated in order from the second main surface of the crystalline semiconductor substrate.

According to an aspect of the present, at least one of the amorphous semiconductor layer of the second conductive type and the amorphous semiconductor layer of the first conductive type includes intrinsic amorphous semiconductor layer.

According to an aspect of the present, the cutting process is a bending and cutting process. The laser processed region has a plurality of convex portion extending toward the first main surface side on the boundary between the laser processed region and the cut processed region. The cut processed region has a stress concentrated marks formed radially from the convex portions of the laser processed region, which marks are generated during the bending and cutting process.

According to an aspect of the present, an average height of the convex portions is equal to or more than 15 μm.

According to an aspect of the present, an average interval between the convex portions is 0.2 to 3.0 times an average height of the convex portions.

According to an aspect of the present, an average length from the second main surface to top of the convex portions is equal to or more than 50% of a length from the second main surface to the first main surface.

According to an aspect of the present, a manufacturing method of a photovoltaic device having a crystalline semiconductor substrate of first conductive type including a first main surface and a second main surface provided on the opposite side of the first main surface, includes following steps. The steps are (a) forming a semiconductor layer of second conductive type on the first main surface of crystalline semiconductor substrate, (b) forming a trench extending form the second main surface toward the first main surface side without reaching the semiconductor layer of second conductive type, by irradiating laser beam from the second main surface of the crystalline semiconductor substrate, (c) separating the crystalline semiconductor substrate and the semiconductor layer of second conductive type by cutting the crystalline semiconductor substrate and the semiconductor layer of second conductive type along the trench.

According to an aspect of the present, the manufacturing method of a photovoltaic device includes a step (d) forming a semiconductor layer of the first conductive type on the second main surface of the crystalline semiconductor substrate. The step (b) includes a step of irradiating the laser beam from the semiconductor layer of the first conductive type.

According to an aspect of the present, the semiconductor layer of the first conductive type has a structure that an amorphous semiconductor layer of the first conductive type and a conductive film layer of the first conductive type are laminated in order from the second main surface of the crystalline semiconductor substrate. The semiconductor layer of second conductive type has a structure that an amorphous semiconductor layer of the second conductive type and a conductive film layer of the second conductive type are laminated in order from the first main surface of the crystalline semiconductor substrate.

According to an aspect of the present, at least one of the amorphous semiconductor layer of the second conductive type and the amorphous semiconductor layer of the first conductive type includes intrinsic amorphous semiconductor layer.

According to an aspect of the present, the step (b) includes a step of forming the trench having a plurality of convex portions extending toward the first main surface. The step (c) includes a step of bending the crystalline semiconductor substrate and the semiconductor layer of second conductive type along the trench.

According to an aspect of the present, the step (b) includes a step of forming the trench having the plurality of the convex portions extending toward the first main surface, by controlling a pulse frequency and a scanning speed of the laser beam.

DETAILED DESCRIPTION OF THE PREFERRED EMBODIMENTS

Hereinafter, a result of extensive study performed by the inventors of the present invention will be described with reference to accompanying drawings. The inventors found out that the reductions in the open voltage Voc and the fill factor F. F. occur when the laser beam is irradiated onto the solar battery 50 from the p-type amorphous semiconductor layer 4 side, and that the reductions in the open voltage Voc and the fill factor F. F. do not occur when the laser beam is irradiated from the n-type amorphous semiconductor layer 8 side. The reasons for these phenomena will be described below.

Figure 1:
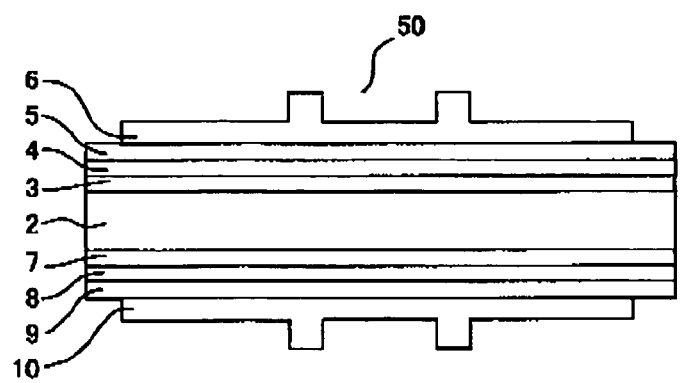
FIG. 1 is a schematic cross-sectional view for explaining a structure of a photovoltaic device having a heterojunction, which is formed by combining an amorphous semiconductor and a crystalline semiconductor.
Figure 2A:
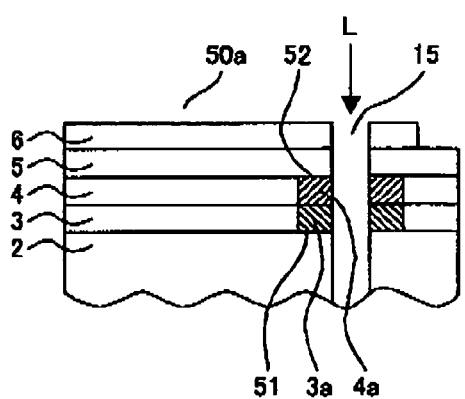
FIGS. 2A and 2B are schematic views showing magnified cross sections in the vicinities of trenches formed by irradiating a laser beam onto the photovoltaic device having the heterojunction, which is formed by combining an amorphous semiconductor and a crystalline semiconductor.
Figure 2B:
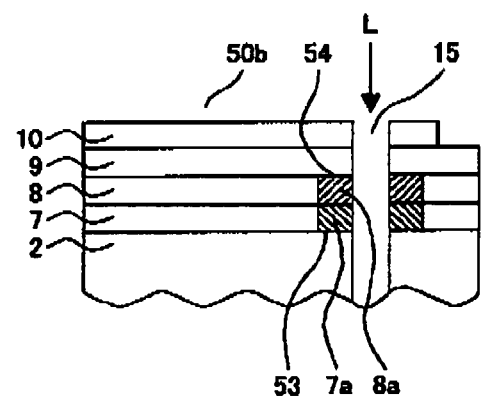

FIGS. 2A and 2B are schematic views showing magnified cross sections of the solar battery 50 in the vicinities of portions subjected to irradiation of the laser beam. The reasons for the above-mentioned phenomena will now be described with reference to FIGS. 2A and 2B.

When the laser beam is irradiated from the p-type amorphous semiconductor layer 4 side as indicated with an arrow L, a cross section of the solar battery 50 is formed into a shape as shown in FIG. 2A. In FIG. 2A, a solar battery 50a is the solar battery after undergoing the irradiation of the laser beam, and a trench 15 is a trench formed in the solar battery 50a by the irradiation of the laser beam.

As shown in FIG. 2A, on an end surface of the solar battery 50a in a position where the p-side collector electrode 6, the p-side transparent conductive film layer 5, the p-type amorphous semiconductor layer 4, the intrinsic amorphous semiconductor layer 3, and part of the n-type crystalline semiconductor substrate 2 are removed, end portions of the intrinsic amorphous semiconductor layer 3 and of the p-type amorphous semiconductor layer 4 are microcrystallized by an influence of heat at the time of the irradiation of the laser beam, and the resistance in these portions becomes lower. In FIG. 2A, reference microcrystal 3a is a microcrystal of the intrinsic amorphous semiconductor layer 3, while microcrystal 4a is a microcrystal of the p-type amorphous semiconductor layer 4. As shown in FIG. 2A, the microcrystal 3a contacts the n-type crystalline semiconductor substrate 2 on an interface 51 with the n-type crystalline semiconductor substrate 2. Meanwhile, the microcrystal 4a contacts the p-side transparent conductive film layer 5 on an interface 52 with the p-side transparent conductive film layer 5. Since the microcrystal 3a and the microcrystal 4a have a small resistance, a leak current flows between the p-type amorphous semiconductor layer 4 and the n-type crystalline semiconductor substrate 2, which have the respectively opposite conductive types, through the microcrystal 4a, the microcrystal 3a, and the interface 51. Therefore, this solar battery 50a shows a low open voltage Voc and a low fill factor F. F.

On the contrary, when the laser beam is irradiated from the n-type amorphous semiconductor layer 8 side as indicated with another arrow L, a cross section of the solar battery 50 is formed into a shape as shown in FIG. 2B. In FIG. 2B, a solar battery 50b is the solar battery after undergoing the irradiation of the laser beam, and a trench 15 is a trench formed in the solar battery 50b by the irradiation of the laser beam.

The cross-sectional shape of the solar battery 50b in this case is similar to the one in the case of FIG. 2A except that the p-type amorphous semiconductor layer 4 and the microcrystal 4a thereof are replaced by the n-type amorphous semiconductor layer 8 and a microcrystal 8a thereof, and that the intrinsic amorphous semiconductor layer 3 and the microcrystal 3a thereof are replaced by the intrinsic amorphous semiconductor layer 7 and a microcrystal 7a thereof. As shown in FIG. 2B, the microcrystal 7a contacts the n-type crystalline semiconductor substrate 2 on an interface 53 with the n-type crystalline semiconductor substrate 2. Meanwhile, the microcrystal 8a contacts the n-side transparent conductive film layer 9 on an interface 54 with the n-side transparent conductive film layer 9. Although the microcrystal 7a and the microcrystal 8a have a small resistance, a leak current does not flow between the n-type amorphous semiconductor layer 8 and the n-type crystalline semiconductor substrate 2 through the microcrystal 8a, the microcrystal 7a, and the interface 53 because the microcrystal 8a and the n-type crystalline semiconductor substrate 2 have the same conductive type. Therefore, this solar battery 50b does not show the reductions in the open voltage Voc and the fill factor F. F.

In the meantime, in the case of using a p-type crystalline semiconductor substrate instead of the n-type crystalline semiconductor substrate 2, a leak current occurs and the open voltage Voc and the fill factor F. F. are reduced when the laser beam is irradiated from the n-type amorphous semiconductor layer side, while a leak current does not occur and the open voltage Voc and the fill factor F. F. are not reduced when the laser beam is irradiated from the p-type amorphous semiconductor layer side.

That is to say, it is possible to manufacture a solar battery which are capable of eliminating occurrence of a leak current and of suppressing reductions in the open voltage Voc and the fill factor F. F., by irradiating the laser beam onto the solar battery so as not to form the microcrystal having a low resistance on the amorphous semiconductor layer that has the different conductive type from the conductive type of the single-crystal substrate.

Specifically, it is possible to manufacture a solar battery capable of eliminating occurrence of a leak current and of suppressing reductions in the open voltage Voc and the fill factor F. F. by irradiating the laser beam from a main surfaces side provided on opposite side of the other main surface on which the amorphous semiconductor layer is formed, and by forming a trench on the solar battery, the trench not reaching the amorphous semiconductor layer. Therefore, it is also possible to manufacture a solar battery capable of eliminating occurrence of a leak current and of suppressing reductions in the open voltage Voc and the fill factor F. F. by irradiating the laser beam from the amorphous semiconductor layer side having the same conductive type as that of the single-crystal substrate and forming the trench on the solar battery, the trench not reaching the amorphous semiconductor layer having the different conductive type from that of the single-crystal substrate.

First Embodiment

A photovoltaic device and a manufacturing method of photovoltaic device according to first embodiment of the present invention will be described with reference to FIG. 3, FIG. 4, and FIG. 5.

Figure 3:
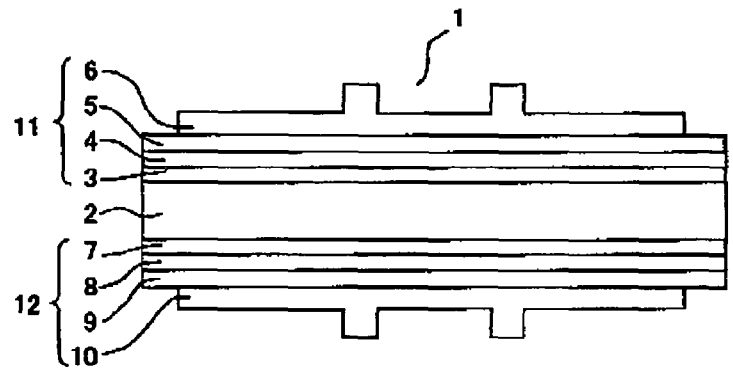
FIG. 3 is a schematic cross-sectional view for explaining a configuration of a structure according to first embodiment of the present invention.

First, a structure 1 having a heterojunction configured by combining an amorphous semiconductor and a crystalline semiconductor as shown in FIG. 3 is fabricated.

FIG. 3 is a schematic cross-sectional view for explaining the configuration of the structure to be manufactured by a method of manufacturing a photovoltaic device according to first embodiment. A structure 1 has the configuration in which a first laminated body 11 is formed on a one main surface of an n-type crystalline semiconductor substrate 2 while a second laminated body 12 is formed on the other main surface provided on opposite side of the one main surface. As the crystalline semiconductor substrate, it is possible to apply a silicon substrate, a germanium substrate or the like which has a single-crystal or polycrystalline structure. The first laminated body 11 has a structure in which an intrinsic amorphous semiconductor layer 3, a p-type amorphous semiconductor layer 4 having a different conductive type from that of the n-type crystalline semiconductor substrate 2, a p-side transparent conductive film layer 5, and a p-side collector electrode 6 are formed on the one main surface of the n-type crystalline semiconductor substrate 2 in the stated order. Moreover, the second laminated body 12 has a structure in which an intrinsic amorphous semiconductor layer 7, an n-type amorphous semiconductor layer 8 having the same conductive type as that of the n-type crystalline semiconductor substrate 2, an n-side transparent conductive film layer 9, and an n-side collector electrode 10 are formed on the other main surface of the n-type single-crystal semiconductor substrate 2 in the stated order. Silicon, germanium, or the like can be used as the amorphous semiconductor.

The intrinsic amorphous semiconductor layer 3, the p-type amorphous semiconductor layer 4, the intrinsic amorphous semiconductor layer 7, and the n-type amorphous semiconductor layer 8 can be respectively formed by use of a plasma CVD (chemical vapor deposition) method. Meanwhile, the p-side transparent conductive film layer 5 and the n-side transparent conductive film layer 9 may apply light-transmissive conductive films such as ITO (indium tin oxide) to be formed by use of a sputtering method, a vacuum vapor deposition method, and the like. Meanwhile, the p-side collector electrode 6 and the n-side collector electrode 10 may apply metal such as Ag to be respectively formed in patterns by use of a screen printing method, the vacuum vapor deposition method, the sputtering method, and the like.

Next, a step of forming trenches on the structure 1 by irradiating a laser beam onto the structure 1 will be described with reference to FIG. 4. FIG. 4 is a schematic cross-sectional view showing a structure 13 with the trenches formed on the structure 1 by irradiating the laser beam onto the structure 1 shown in FIG. 3. As shown in FIG. 4, the laser beam as indicated with arrows L is irradiated onto the structure 1 from the other main surface side of the n-type crystalline semiconductor substrate 2, or from the second laminated body 12 side including the n-type amorphous semiconductor layer 8 having the same conductive type as that of the n-type crystalline semiconductor substrate 2 in the first embodiment, thereby forming trenches 15 on the second laminated body 12 and on the n-type crystalline semiconductor substrate 2 and fabricating the structure 13.

Figure 4:
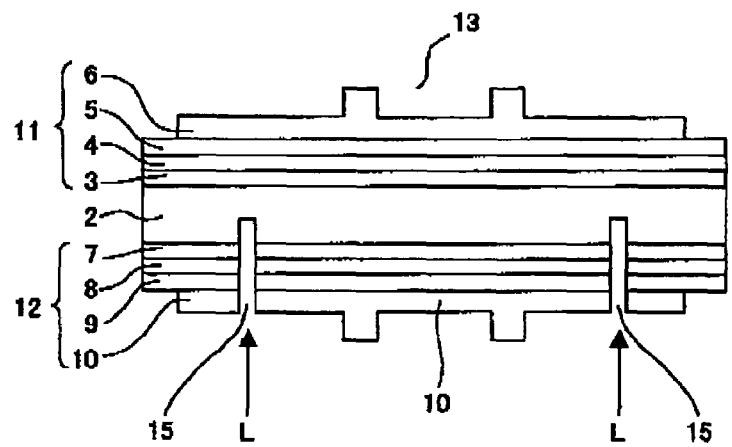
FIG. 4 is a schematic cross-sectional view for explaining a step of forming trenches on the structure according to first embodiment of the present invention by irradiating a laser beam onto the structure.

In the first embodiment, the trenches 15 are formed on the n-side collector electrode 10, the n-side transparent conductive film layer 9, the n-type amorphous semiconductor layer 8, the intrinsic amorphous semiconductor layer 7, and the n-type crystalline semiconductor substrate 2 as shown in FIG. 4. However, it is only necessary that the trenches 15 do not reach the p-type amorphous semiconductor layer 4 having the different conductive type from that of the n-type crystalline semiconductor substrate 2. Accordingly, the depth of the trenches 15 can be appropriately selected so as to facilitate separating along the trenches 15 after the formation of the trenches 15.

At this time, conditions for irradiation of the laser beam such as irradiation time of the laser beam or irradiation energy thereof can be adjusted appropriately so as to stop the trenches 15 in the n-type crystalline semiconductor substrate 2 and not to reach the p-type amorphous semiconductor layer 4 having the different conductive type from that of the n-type crystalline semiconductor substrate 2. If the laser beam is irradiated so as to cause the trenches 15 to reach the p-type amorphous semiconductor layer 4 having the different conductive type from that of the n-type crystalline semiconductor substrate 2, microcrystals having a low resistance are formed in the vicinities of the trenches 15 on the p-type amorphous semiconductor layer 4 and a leak current will flow between the microcrystals and the n-type crystalline semiconductor substrate 2. Therefore, a photovoltaic device thus manufactured will incur reductions in the open voltage Voc and the fill factor F. F.

As to the conditions for irradiation of the laser beam for forming the above-described trenches 15, it is possible to use a laser having a wavelength exceeding 400 nm, such as a YAG (yttrium aluminum garnet) laser or a second harmonic wave of an Ar laser and to apply power in a range from 1 to 20 W, for example. Moreover, as to a beam diameter of the laser beam, it is possible to use one having the beam diameter in a range from 20 to 200 μm, for example. By irradiating the laser beam satisfying the foregoing conditions, it is possible to form the trenches 15 having the width substantially equal to the beam diameter of the laser beam.

In structure shown in FIG. 4, a portion in the vicinity of each of the trenches 15 on the first laminated body 11 and on the n-type crystalline semiconductor substrate 2 is similar to the structure shown in FIG. 2B. As shown in FIG. 2B, end portions of the n-type amorphous semiconductor layer 8 and the intrinsic amorphous semiconductor layer 7 are microcrystallized due to an influence of heat by irradiation of the laser beam, thereby forming a microcrystal 8a and a microcrystal 7a, respectively. Although the microcrystal 8a and the microcrystal 7a have a low resistance, no leak currents flow between the n-type amorphous semiconductor layer 8 and the n-type crystalline semiconductor substrate 2 because the microcrystal 8a and the n-type crystalline semiconductor substrate 2 have the same conductive type.

Figure 5:
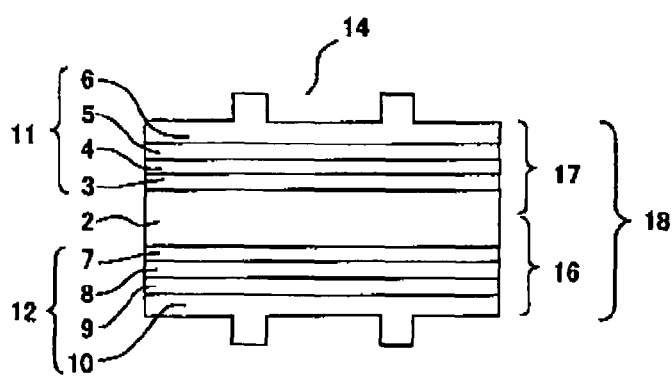
FIG. 5 is a schematic cross-sectional view for explaining a configuration of a photovoltaic device according to first embodiment of the present invention.

Subsequently, as shown in FIG. 5, the structure 13 is separated along the trenches 15. FIG. 5 is a schematic cross-sectional view showing a photovoltaic device 14 according to the present invention, which is obtained by separating the structure 13 along the trenches 15. As the separating method, it is possible to apply a cutting process described below. Specifically, the cutting process may be a process to hold peripheral portions of the structure 13 with holders, and to bend the structure 13 along the trenches 15. The cutting process may be a process to cut the structure 13 along the trenches 15 by use of a scrubber, a dicing saw or the like, for example. It is possible to fabricate the photovoltaic device 14 in a desired size by separating the structure 13 as described above.

By the above-described fabrication process, it is possible to fabricate the photovoltaic device 14 in which at least one of side surfaces interposed between the one main surface of the n-type crystalline semiconductor substrate 2 and the other main surface provided on the opposite side of the one main surface is formed as a separate processed side surface 18 as shown in FIG. 5. Here, the separate processed side surface 18 includes a laser processed region 16 formed by laser process, which extends from the other main surface side toward the one main surface side, the region not reaching the p-type amorphous semiconductor layer 4 having the different conductive type from that of the n-type crystalline semiconductor substrate 2, and a cut processed region 17 formed by cutting process, which extends from the one main surface side toward the other main surface side.

According to the first embodiment, it is possible to manufacture a photovoltaic device in a desired size having a heterojunction formed by combining an amorphous semiconductor and a crystalline semiconductor, which is capable of eliminating occurrence of a leak current between the crystalline semiconductor and the amorphous semiconductor and of suppressing reductions in the open voltage Voc and the fill factor F. F.

Second Embodiment

Now, a structure of a photovoltaic device manufactured by a manufacturing method thereof according to the second embodiment will be described with reference schematic cross-sectional views shown in FIG. 6, FIG. 7, and FIG. 8.

Figure 6:
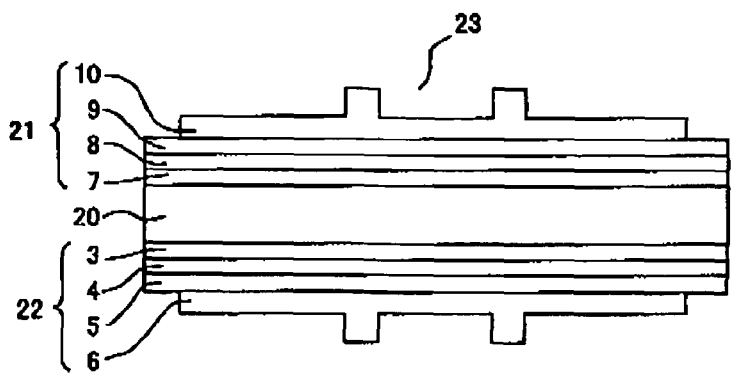
FIG. 6 is a schematic cross-sectional view for explaining a configuration of a structure according to second embodiment of the present invention.

First, a structure 23 having a heterojunction of a configuration to be formed by combining an amorphous semiconductor and a crystalline semiconductor as shown in FIG. 6 is fabricated.

FIG. 6 is a schematic cross-sectional view for explaining the configuration of the structure to be manufactured by the method of manufacturing a photovoltaic device according to the second embodiment. The structure 23 has the configuration in which a first laminated body 21 is formed on a one main surface of a p-type crystalline semiconductor substrate 20 while a second laminated body 22 is formed on the other main surface provided on opposite side of the one main surface. As the crystalline semiconductor substrate, it is possible to apply a silicon substrate, a germanium substrate or the like which has a single-crystal or polycrystalline structure. The first laminated body 21 has a structure in which an intrinsic amorphous semiconductor layer 7, an n-type amorphous semiconductor layer 8 having the different conductive type from that of the p-type crystalline semiconductor substrate 20, an n-side transparent conductive film layer 9, and an n-side collector electrode 10 are formed on the one main surface of the p-type crystalline semiconductor substrate 20 in the stated order. Moreover, the second laminated body 22 has a structure in which an intrinsic amorphous semiconductor layer 3, a p-type amorphous semiconductor layer 4 having the same conductive type as that of the p-type crystalline semiconductor substrate 20, a p-side transparent conductive film layer 5, and a p-side collector electrode 6 are formed on the other main surface of the p-type crystalline semiconductor substrate 20 in the stated order. Silicon, germanium, or the like can be used as the amorphous semiconductor.

The method of fabricating the structure 23 is similar to the method of fabricating the structure 1 in the first embodiment, expect that the n-type crystalline semiconductor substrate 2 is replaced by the p-type crystalline semiconductor substrate 20, that the n-type amorphous semiconductor layer 8 is replaced by the p-type amorphous semiconductor layer 4, that the p-type amorphous semiconductor layer 4 is replaced by the n-type amorphous semiconductor layer 8, that the intrinsic amorphous semiconductor layer 7 is replaced by the intrinsic amorphous semiconductor layer 3, that the intrinsic amorphous semiconductor layer 3 is replaced by the intrinsic amorphous semiconductor layer 7, that the n-side transparent conductive film layer 9 is replaced by the p-side transparent conductive film layer 5, that the p-side transparent conductive film layer 5 is replaced by the n-side transparent conductive film layer 9, that the n-side collector electrode 10 is replaced by the p-side collector electrode 6, and that the p-side collector electrode 6 is replaced by the n-side collector electrode 10.

Next, a step of forming trenches on the structure 23 by irradiating a laser beam onto the structure 23 will be described with reference to FIG. 7. FIG. 7 is a schematic cross-sectional view showing a structure 24 with the trenches formed on the structure 23 by irradiating the laser beam onto the structure 23 shown in FIG. 6. As shown in FIG. 7, the laser beam as indicated with arrows L is irradiated onto the structure 23 from the other main surface side of the p-type crystalline semiconductor substrate 20, or from the second laminated body 22 side including the p-type amorphous semiconductor layer 4 having the same conductive type as that of the p-type crystalline semiconductor substrate 20 in the second embodiment, thereby forming trenches 15 on the second laminated body 22 and on the p-type crystalline semiconductor substrate 20 and fabricating the structure 24.

Conditions for irradiation of the laser beam for forming the above-described trenches 15 are similar to those in the case of the first embodiment.

At this time, the conditions for irradiation of the laser beam such as irradiation time of the laser beam or irradiation energy thereof can be adjusted appropriately so as to stop the trenches 15 in the p-type crystalline semiconductor substrate 20 and not to reach the n-type amorphous semiconductor layer 8 having the different conductive type from that of the p-type crystalline semiconductor substrate 20. If the laser beam is irradiated so as to cause the trenches 15 to reach the n-type amorphous semiconductor layer 8 having the different conductive type from that of the p-type crystalline semiconductor substrate 20, microcrystals having a low resistance are formed in the vicinities of the trenches 15 on the n-type amorphous semiconductor layer 8 and a leak current will flow between the microcrystals and the p-type crystalline semiconductor substrate 20. Therefore, a photovoltaic device thus manufactured will incur reductions in the open voltage Voc and the fill factor F. F.

Figure 7:
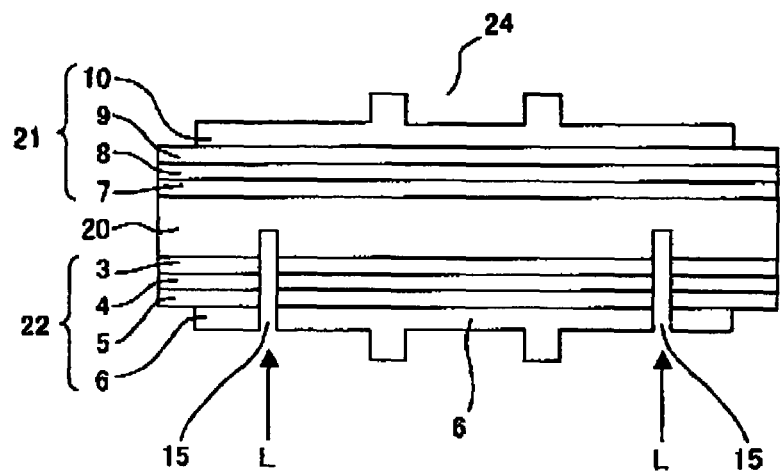
FIG. 7 is a schematic cross-sectional view for explaining a step of forming trenches on the structure according to second embodiment of the present invention by irradiating a laser beam onto the structure.

In the second embodiment, the trenches 15 are formed on the p-side collector electrode 6, the p-side transparent conductive film layer 5, the p-type amorphous semiconductor layer 4, the intrinsic amorphous semiconductor layer 3, and the p-type crystalline semiconductor substrate 20 as shown in FIG. 7. However, it is only necessary that the trenches 15 do not reach the n-type amorphous semiconductor layer 8 having the different conductive type from that of the p-type crystalline semiconductor substrate 20. Accordingly, the depth of the trenches 15 can be appropriately selected so as to facilitate separating along the trenches 15 after formation of the trenches 15.

In structure shown in FIG. 7, a portion in the vicinity of each of the trenches 15 on the second laminated body 22 and on the p-type crystalline semiconductor substrate 20 is similar to the structure shown in FIG. 2A except that the n-type crystalline semiconductor substrate 2 is replaced by the p-type crystalline semiconductor substrate 20. In this case, end portions of the p-type amorphous semiconductor layer 4 and the intrinsic amorphous semiconductor layer 3 are microcrystallized due to an influence of heat by irradiation of the laser beam, thereby forming a microcrystal 4a and a microcrystal 3a, respectively. Although the microcrystal 4a and the microcrystal 3a have a low resistance, no leak currents flow between the p-type amorphous semiconductor layer 4 and the p-type crystalline semiconductor substrate 20 because the microcrystal 4a and the p-type crystalline semiconductor substrate 20 have the same conductive type.

Figure 8:
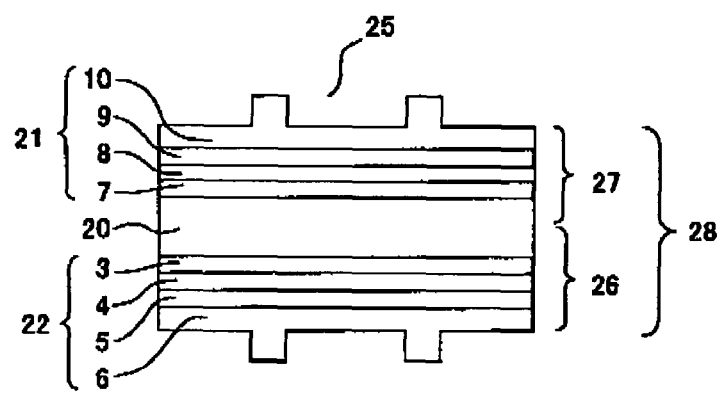
FIG. 8 is a schematic cross-sectional view for explaining a configuration of a photovoltaic device according to second embodiment of the present invention.

Subsequently, as shown in FIG. 8, the structure 24 is separated along the trenches 15. The separating method is similar to the case of the first embodiment. It is possible to fabricate a photovoltaic device 25 in a desired size by separating the structure 24 as described above.

According to the second embodiment, it is possible to manufacture a photovoltaic device in a desired size having a heterojunction formed by combining an amorphous semiconductor and a crystalline semiconductor, which is capable of eliminating occurrence of a leak current between the crystalline semiconductor and the amorphous semiconductor and of suppressing reductions in the open voltage Voc and the fill factor F. F.

Example 1

Now, an example of the method of manufacturing a photovoltaic device according to the above-described first embodiment will be explained with reference to FIG. 3, FIG. 4, and FIG. 5.

First, the n-type crystalline semiconductor substrate 2, having resistivity approximately equal to 1 Ω·cm, the size equal to 10.4 cm×10.4 cm, the thickness approximately equal to 200 μm, is cleaned and subsequently placed in a vacuum chamber, and is then heated up to 170° C. Next, hydrogen gas is introduced into the chamber to cause plasma discharge. In this way, a surface treatment on the other main surface of the n-type crystalline semiconductor substrate 2 is performed.

Thereafter, $SiH_4$ gas and hydrogen gas are introduced into the chamber and the intrinsic amorphous semiconductor layer 7 is formed in the thickness of 10 nm on the other main surface of the above-described n-type crystalline semiconductor substrate 2 by the plasma CVD method. Subsequently, $SiH_4$ gas, $PH_3$ gas, and hydrogen gas are introduced into the chamber and the n-type amorphous semiconductor layer 8 is formed in the thickness of 5 nm on the intrinsic amorphous semiconductor layer 7 by the plasma CVD method.

Next, the n-type crystalline semiconductor substrate 2 on which the intrinsic amorphous semiconductor layer 7 and the n-type amorphous semiconductor layer 8 are formed is taken out of the chamber and placed again in the chamber. The n-type crystalline semiconductor substrate 2 is heated up to 170° C., and a treatment similar to the above-described surface treatment on the other main surface is performed on the one main surface provided on opposite side of the other main surface.

Thereafter, $SiH_4$ gas and hydrogen gas are introduced into the chamber and the intrinsic amorphous semiconductor layer 3 is formed in the thickness of 10 nm on the one main surface of the above-described n-type crystalline semiconductor substrate 2 by the plasma CVD method. Subsequently, $SiH_4$ gas, $B_2H_6$ gas, and hydrogen gas are introduced into the chamber and the p-type amorphous semiconductor layer 4 is formed in the thickness of 5 nm on the intrinsic amorphous semiconductor layer 3 by the plasma CVD method.

Layer forming conditions for the above-described amorphous semiconductor layers are shown in Table 1. In Table 1, the "i-type" means the intrinsic amorphous semiconductor layer 3 and the intrinsic amorphous semiconductor layer 7, the "p-type" means the p-type amorphous semiconductor layer 4, and the "n-type" means the n-type amorphous semiconductor layer 8, respectively. Moreover, the $B_2H_6$ gas and the $PH_3$ gas are diluted to 2% and 1%, respectively, by use of the $H_2$ gas.

TABLE 1

| Amorphous semiconductor | Gas flow rates (sccm) | | | | Substrate temperature (° C.) | Discharge gas pressure (Pa) | Discharge power (mW/cm$^2$) |
| --- | --- | --- | --- | --- | --- | --- | --- |
| | $SiH_4$ | $B_2H_6$ (2%) | $PH_3$ (1%) | $H_2$ | | | |
| p-type | 40 | 40 | — | 0 to 100 | 170 | 40 | 8.33 |
| n-type | 40 | — | 40 | 0 to 100 | 170 | 40 | 8.33 |
| i-type | 40 | — | — | 0 to 100 | 170 | 40 | 8.33 |

Next, the n-side transparent conductive film layer 9 and the p-side transparent conductive film layer 5 made of ITO in the thickness of 100 nm are respectively formed, by the sputtering method, on the n-type amorphous semiconductor layer 8 and the p-type amorphous semiconductor layer 4, which are formed on the respective main surfaces of the n-type crystalline semiconductor substrate 2.

Next, the n-side collector electrode 10 and the p-side collector electrode 6 made of silver paste are respectively applied to the n-side transparent conductive film layer 9 formed on the other main surface side of the n-type crystalline semiconductor substrate 2 and to the p-side transparent conductive film layer 5 formed on the one main surface side thereof by the screen printing method. Then, the silver paste is hardened by baking at a temperature of about 180° C. for about 1 hour. In this way, the second laminated body 12 and the first laminated body 11 are completed. The structure 1 is thus fabricated.

Subsequently, the laser beam is irradiated onto the structure 1, and the trenches are formed on the structure 1 by removing the portions of the structure where the laser beam is irradiated.

In this case, a YAG laser having a laser beam diameter of 50 μm and a wavelength of 1064 nm is applied. The laser beam having power in a range from 3 to 5 W is irradiated onto the structure 1 as shown in FIG. 4. Specifically, the laser beam is irradiated in the direction of the arrows L from the second laminated body 12 side, that is, from the other main surface side of the n-type crystalline semiconductor substrate 2. By performing irradiation of the laser beam as described above, the portions of the first laminated body 11 and of the n-type crystalline semiconductor substrate 2 are removed to form the trenches 15 on the structure 1 as shown in FIG. 4. In this way, the structure 13 is fabricated. By appropriately adjusting the conditions for irradiation of the laser beam, the trenches 15 are formed in the depth not to reach the p-type amorphous semiconductor layer 4 having the different conductive type from that of the n-type crystalline semiconductor substrate 2. The depth of the trenches 15 is approximately equal to 60 μm, and the width of the trenches 15 is approximately the same as the above-mentioned laser beam diameter.

Lastly, the structure 13 is mechanically separated along the trenches 15 by applying stress to the structure 13. The photovoltaic device 14 in a desired size is fabricated by this separating operation (FIG. 5).

By the above-described fabrication process, it is possible to fabricate the photovoltaic device 14 in which at least one of the side surfaces interposed between the one main surface of the n-type crystalline semiconductor substrate 2 and the other main surface provided on opposite side of the one main surface is formed as the separate processed side surface 18 as shown in FIG. 5. Here, the separate processed side surface 18 includes the laser processed region 16 formed by laser process, which extends from the other main surface side toward the one main surface side, the region not reaching the p-type amorphous semiconductor layer 4 having the different conductive type from that of the n-type single-crystal semiconductor substrate 2, and the cut processed region 17 formed by cutting process, which extends from the one main surface side toward the other main surface side.

Example 2

Now, an example of the method of manufacturing a photovoltaic device according to the above-described second embodiment will be explained with reference to FIG. 6, FIG. 7, and FIG. 8.

First, the p-type crystalline semiconductor substrate 20 having resistivity approximately equal to 1 Ω·cm, the size equal to 10.4 cm×10.4 cm, the thickness approximately equal to 200 μm is cleaned and subsequently placed in the vacuum chamber, and is then heated up to 170° C. Next, hydrogen gas is introduced into the chamber to cause plasma discharge. In this way, a surface treatment on the other main surface of the p-type crystalline semiconductor substrate 20 is performed.

Thereafter, $SiH_4$ gas and hydrogen gas are introduced into the chamber and the intrinsic amorphous semiconductor layer 3 is formed in the thickness of 10 nm on the other main surface of the above-described p-type crystalline semiconductor substrate 20 by the plasma CVD method. Subsequently, $SiH_4$ gas, $B_2H_6$ gas, and hydrogen gas are introduced into the chamber and the p-type amorphous semiconductor layer 4 is formed in the thickness of 5 nm on the intrinsic amorphous semiconductor layer 3 by the plasma CVD method.

Next, the p-type crystalline semiconductor substrate 20 on which the intrinsic amorphous semiconductor layer 3 and the p-type amorphous semiconductor layer 4 are formed is taken out of the chamber and placed again in the chamber. The p-type crystalline semiconductor substrate 20 is heated up to 170° C., and a treatment similar to the above-described surface treatment on the other main surface is performed on the one main surface provided on opposite side of the other main surface.

Thereafter, $SiH_4$ gas and hydrogen gas are introduced into the chamber and the intrinsic amorphous semiconductor layer 7 is formed in the thickness of 10 nm on the one main surface of the above-described p-type crystalline semiconductor substrate 20 by the plasma CVD method. Subsequently, $SiH_4$ gas, $PH_3$ gas, and hydrogen gas are introduced into the chamber and the n-type amorphous semiconductor layer 8 is formed in the thickness of 5 nm on the intrinsic amorphous semiconductor layer 7 by the plasma CVD method.

Layer forming conditions for the above-described amorphous semiconductor layers are similar to those shown in Table 1 of Example 1.

Next, the p-side transparent conductive film layer 5 and the n-side transparent conductive film layer 9 made of ITO in the thickness of 100 nm are respectively formed, by the sputtering method, on the p-type amorphous semiconductor layer 4 and the n-type amorphous semiconductor layer 8, which are formed on the respective main surfaces of the p-type crystalline semiconductor substrate 20.

Next, the p-side collector electrode 6 and the n-side collector electrode 10 made of silver paste are respectively applied to the p-side transparent conductive film layer 5 formed on the other main surface side of the p-type crystalline semiconductor substrate 20 and to the n-side transparent conductive film layer 9 formed on the one main surface side thereof by the screen printing method. Then, the silver paste is hardened by baking at a temperature of about 180° C. for about 1 hour. In this way, the second laminated body 22 and the first laminated body 21 are completed. The structure 23 is thus fabricated.

Subsequently, the laser beam is irradiated onto the structure 23, and the trenches are formed on the structure 23 by removing the portions of the structure where the laser beam is irradiated.

In this case, the YAG laser having the laser beam diameter of 50 μm and the wavelength of 1064 nm is applied as similar to Example 1. The laser beam having power in a range from 3 to 5 W is irradiated onto the structure 23 as shown in FIG. 7. Specifically, the laser beam is irradiated in the direction of the arrows L from the second laminated body 22 side, that is, from the other main surface side of the p-type crystalline semiconductor substrate 20. By performing irradiation of the laser beam as described above, the portions of the second laminated body 22 and of the p-type crystalline semiconductor substrate 20 are removed to form the trenches 15 on the structure 23 as shown in FIG. 7. In this way, the structure 24 is fabricated. By appropriately adjusting the conditions for irradiation of the laser beam as similar to Example 1, the trenches 15 are formed in the depth not to reach the n-type amorphous semiconductor layer 8 having the different conductive type from that of the p-type crystalline semiconductor substrate 20. The depth of the trenches 15 is approximately equal to 60 μm, and the width of the trenches 15 is approximately the same as the above-mentioned laser beam diameter.

Lastly, the structure 24 is mechanically separated along the trenches 15 by applying stress to the structure 24. The photovoltaic device 25 in a desired size is fabricated by this separating operation (FIG. 8).

By the above-described fabrication process, it is possible to fabricate the photovoltaic device 25 in which at least one of the side surfaces interposed between the one main surface of the p-type crystalline semiconductor substrate 20 and the other main surface provided on opposite side of the one main surface is formed as a separate processed surface 28 as shown in FIG. 8. Here, the separate processed surface 28 includes a laser processed region 26 formed by laser process, which extends from the other main surface side toward the one main surface side, the region not reaching the n-type amorphous semiconductor layer 8 having the different conductive type from that of the p-type crystalline semiconductor substrate 20, and a cut processed region 27 formed by cutting process, which extends from the one main surface side toward the other main surface side.

Comparative Example 1

Now, Comparative Example 1 will be explained with reference to FIG. 3, FIG. 9, and FIG. 10.

In Comparative Example 1, the structure 1 which is the same as the case in Example 1 shown in FIG. 3 is fabricated as similar to the case in Example 1.

Figure 9:
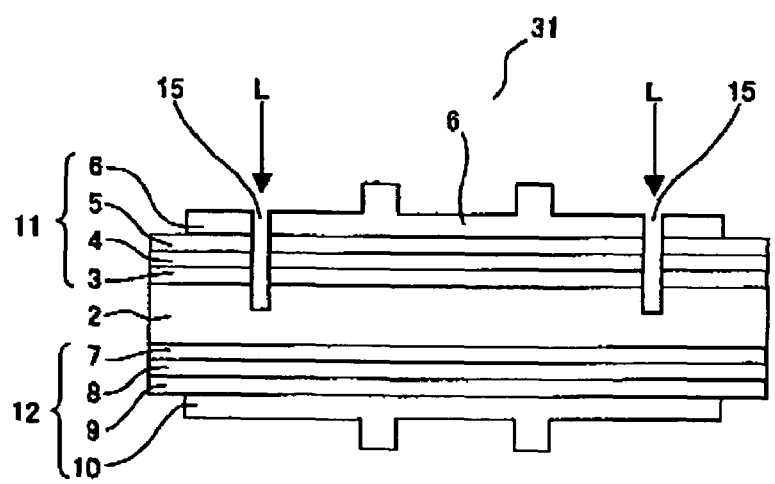
FIG. 9 is a schematic cross-sectional view for explaining a step of forming trenches on a structure according to Comparative Example 1 by irradiating a laser beam onto the structure.

Subsequently, as shown in FIG. 9, the laser beam is irradiated onto the structure 1 from an opposite side to the side in the case of Example 1, that is, from the first laminated body 11 side, and the trenches 15 are formed on the structure 1 by removing the portions of the structure where the laser beam is irradiated. In this way, a structure 31 is fabricated.

In this case, the YAG laser having the laser beam diameter of 50 μm and the wavelength of 1064 nm is applied as similar to Example 1. The laser beam having power in the range from 3 to 5 W is irradiated onto the structure 1 in the direction of the arrows L from the first laminated body 11 side as shown in FIG. 9. By performing irradiation of the laser beam as described above, the portions of the first laminated body 11 and of the n-type crystalline semiconductor substrate 2 are removed to form the trenches 15 on the structure 1 as shown in FIG. 9. In this way, the structure 31 is fabricated. By appropriately adjusting the conditions for irradiation of the laser beam as similar to Example 1, the trenches 15 are formed in the depth not to reach the n-type amorphous semiconductor layer 8 having the same conductive type as that of the n-type crystalline semiconductor substrate 2. The depth of the trenches 15 is approximately equal to 60 μm, and the width of the trenches 15 is approximately the same as the above-mentioned laser beam diameter.

Lastly, the structure 31 is mechanically separated along the trenches 15 by applying stress to the structure 31. A photovoltaic device 32 in a desired size is fabricated by this separating operation.

Figure 10:
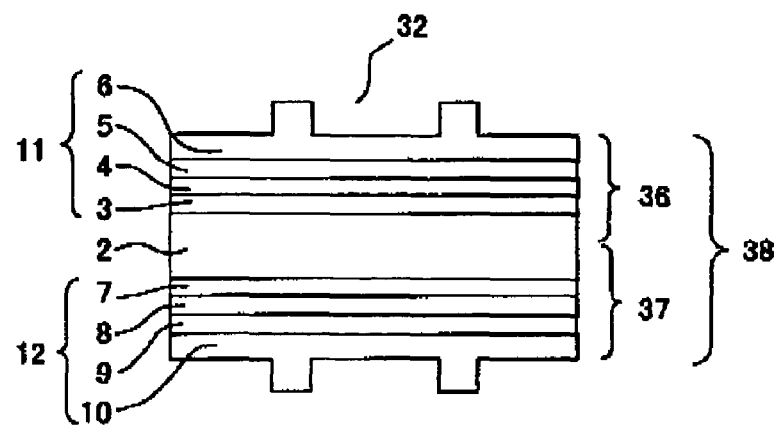
FIG. 10 is a schematic cross-sectional view for explaining a configuration of a photovoltaic device according to Comparative Example 1.

By the above-described fabrication process, it is possible to fabricate the photovoltaic device 32 in which at least one of the side surfaces interposed between the one main surface of the n-type crystalline semiconductor substrate 2 and the other main surface provided on opposite side of the one main surface is formed as a separate processed surface 38 as shown in FIG. 10. Here, the separate processed surface 38 includes a laser processed region 36 formed by laser process, which extends from the one main surface side toward the other main surface side, the region not reaching the n-type amorphous semiconductor layer 8 having the same conductive type as that of the n-type single-crystal semiconductor substrate 2, and a cut processed region 37 formed by cutting process, which extends from the other main surface side toward the one main surface side.

Comparative Example 2

Now, Comparative Example 2 will be explained with reference to FIG. 6, FIG. 11, and FIG. 12.

In Comparative Example 2, the structure 23 which is the same as the case in Example 2 shown in 4 is fabricated as similar to the case in Example 2.

Figure 11:
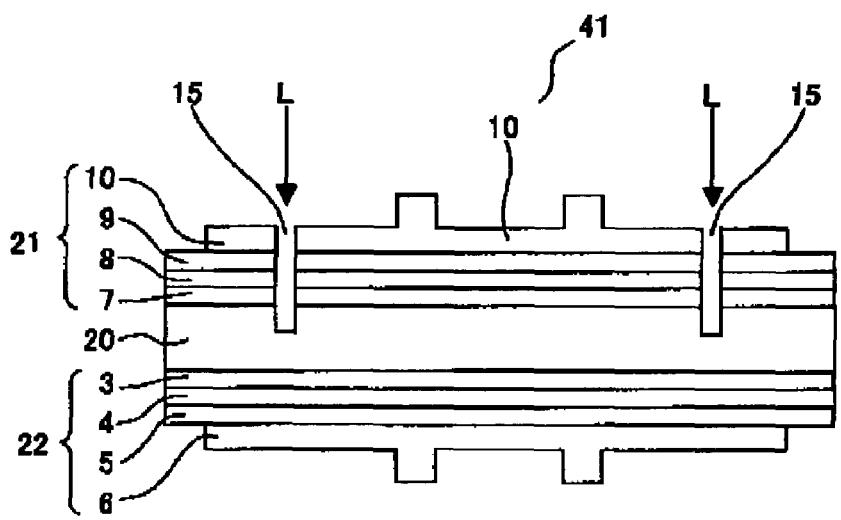
FIG. 11 is a schematic cross-sectional view for explaining a step of forming trenches on a structure according to Comparative Example 2 by irradiating a laser beam onto the structure.

Subsequently, as shown in FIG. 11, the laser beam is irradiated onto the structure 23 from an opposite side to the side in the case of Example 2, that is, from the first laminated body 21 side, and the trenches 15 are formed on the structure 23 by removing the portions of the structure where the laser beam is irradiated. In this way, a structure 41 is fabricated.

In this case, the YAG laser having the laser beam diameter of 50 μm and the wavelength of 1064 nm is applied as similar to Example 2. The laser beam having power in the range from 3 to 5 W is irradiated onto the structure 23 as shown in FIG. 11. Specifically, the laser beam is irradiated in the direction of the arrows L from the first laminated body 21 side. By performing irradiation of the laser beam as described above, the portions of the first laminated body 21 and of the p-type crystalline semiconductor substrate 20 are removed to form the trenches 15 on the structure 23 as shown in FIG. 11. In this way, the structure 41 is fabricated. By appropriately adjusting the conditions for irradiation of the laser beam as similar to Example 2, the trenches 15 are formed in the depth not to reach the p-type amorphous semiconductor layer 4 having the same conductive type as that of the p-type crystalline semiconductor substrate 20. The depth of the trenches 15 is approximately equal to 60 μm, and the width of the trenches 15 is approximately the same as the above-mentioned laser beam diameter.

Lastly, the structure 41 is mechanically separated along the trenches 15 by applying stress to the structure 41. A photovoltaic device 42 in a desired size is fabricated by this separating operation.

Figure 12:
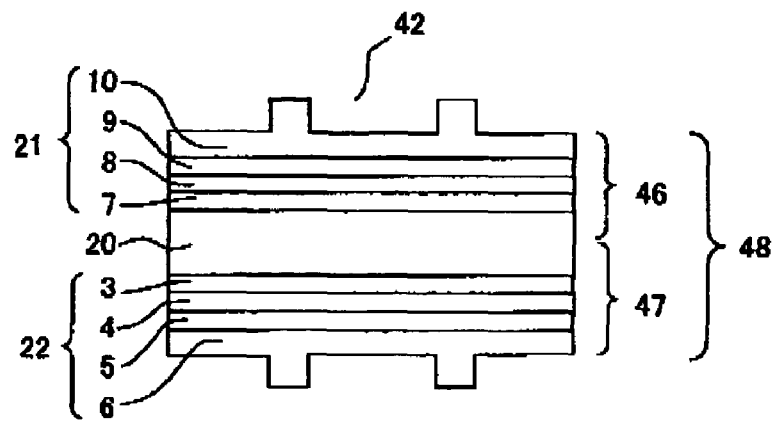
FIG. 12 is a schematic cross-sectional view for explaining a configuration of a photovoltaic device according to Comparative Example 2.

By the above-described fabrication process, it is possible to fabricate the photovoltaic device 42 in which at least one of the side surfaces interposed between the one main surface of the p-type crystalline semiconductor substrate 20 and the other main surface provided on opposite side of the one main surface is formed as a separate processed surface 48 as shown in FIG. 12. Here, the separate processed surface 48 includes a laser processed region 46 formed by laser process which extends from the one main surface side toward the other main surface side, the region not reaching the p-type amorphous semiconductor layer 4 having the same conductive type as that of the p-type crystalline semiconductor substrate 20, and a cut processed region 47 formed by cutting process which extends from the other main surface side toward the one main surface side.

(Evaluation Result)

Output characteristics are measured in terms of the photovoltaic devices of Example 1, Example 2, Comparative Example 1, and Comparative Example 2 respectively manufactured as described above. Measurement results of the output characteristics concerning the photovoltaic devices according to Example 1 and Comparative Example 1 are shown in Table 2, while those of the output characteristics concerning the photovoltaic devices according to Example 2 and Comparative Example 2 are shown in Table 3.

TABLE 2

| | Voc (V) | Isc (A) | F. F. | Pmax (W) |
|---|---|---|---|---|
| Example 1 | 0.702 | 3.725 | 0.775 | 2.026 |
| Comparative Example 1 | 0.695 | 3.722 | 0.758 | 1.960 |

TABLE 3

| | Voc (V) | Isc (A) | F. F. | Pmax (W) |
|---|---|---|---|---|
| Example 2 | 0.676 | 3.686 | 0.745 | 1.858 |
| Comparative Example 2 | 0.674 | 3.680 | 0.700 | 1.736 |

As it is apparent from Table 2, the photovoltaic device of Example 1 has higher values in the open voltage Voc, the short-circuit current Isc, the fill factor F. F., and the maximum output Pmax than those values of the photovoltaic device of Comparative Example 1, and therefore has superior characteristics. Example 1 and Comparative Example 1 have the following difference. Specifically, in Example 1, the laser beam is irradiated onto the structure 1 from the other main surface side of the n-type crystalline semiconductor substrate 2, that is, from the main surface side opposite with the main surface on which the p-type amorphous semiconductor layer 4 having the different conductive type from that of the n-type crystalline semiconductor substrate 2 is formed. On the contrary, in Comparative Example 1, the laser beam is irradiated onto the structure 31 from the one main surface side of the n-type crystalline semiconductor substrate 2, that is, from the first laminated body 11 side that includes the p-type amorphous semiconductor layer 4 having the different conductive type from that of the n-type crystalline semiconductor substrate 2.

In the case of Comparative Example 1, after irradiation of the laser beam, the configuration of the structure 31 in the vicinity of a laser beam irradiated portion becomes similar to the configuration of the solar battery 50a shown in FIG. 2A. On an end surface of the structure 31 in the vicinity of the laser beam irradiated portion, the end portion of the intrinsic amorphous semiconductor layer 3 and the end portion of the p-type amorphous semiconductor layer 4 are microcrystallized due to an influence of the heat at the time of irradiation of the laser, whereby the resistance of these portions is reduced. Therefore, a leak current flows between the p-type amorphous semiconductor layer 4 and the n-type crystalline semiconductor substrate 2 which have respectively the opposite conductive types. For this reason, the photovoltaic device 32 of Comparative Example 1 fabricated as described above shows reductions in the open voltage Voc and the fill factor F. F.

On the contrary, in Example 1, the laser beam is irradiated onto the structure 1 from the main surface side provided on opposite side of the main surface on which the p-type amorphous semiconductor layer 4 having the different conductive type from that of the n-type crystalline semiconductor substrate 2 is formed. Accordingly, unlike Comparative Example 1, no leak currents flow between the p-type amorphous semiconductor layer 4 and the n-type crystalline semiconductor substrate 2 which have respectively the opposite conductive types.

For this reason, as described previously, the photovoltaic device of Example 1 is considered to possess the superior characteristics to those of the photovoltaic device of Comparative Example 1.

As it is apparent from Table 3, the photovoltaic device of Example 2 has higher values in the open voltage Voc, the short-circuit current Isc, the fill factor F. F., and the maximum output Pmax than those for the photovoltaic device of Comparative Example 2, and therefore has superior characteristics.

Example 2 and Comparative Example 2 have the following difference. Specifically, in Example 2, the laser beam is irradiated onto the structure 23 from the other main surface side of the p-type crystalline semiconductor substrate 20, that is, from the main surface side provided on opposite side of the main surface on which the n-type amorphous semiconductor layer 8 having the different conductive type from that of the p-type crystalline semiconductor substrate 20 is formed. On the contrary, in Comparative Example 2, the laser beam is irradiated onto the structure 41 from the one main surface side of the p-type crystalline semiconductor substrate 20, that is, from the first laminated body 21 side that includes the n-type amorphous semiconductor layer 8 having the different conductive type from that of the p-type crystalline semiconductor substrate 20.

In the case of Comparative Example 2, the configuration in the vicinity of a laser beam irradiated portion of the structure 41 after the irradiation of the laser beam becomes similar to the configuration of the solar battery 50b shown in FIG. 2B where n-type crystalline semiconductor substrate 2 is replaced by p-type crystalline semiconductor substrate 20. On an end surface of the structure 41 in the vicinity of the laser beam irradiated portion, the end portion of the intrinsic amorphous semiconductor layer 7 and the end portion of the n-type amorphous semiconductor layer 8 are microcrystallized due to an influence of the heat at the time of the irradiation of the laser, whereby the resistance of these portions is reduced. Therefore, a leak current flows between the n-type amorphous semiconductor layer 8 and the p-type crystalline semiconductor substrate 20 which have respectively the opposite conductive types. For this reason, the photovoltaic device 42 of Comparative Example 2 fabricated as described above shows reductions in the open voltage Voc and the fill factor F. F.

On the contrary, in Example 2, the laser beam is irradiated onto the structure 23 from the main surface side provided on opposite side of the main surface on which the n-type amorphous semiconductor layer 8 having the different conductive type from that of the p-type crystalline semiconductor substrate 20 is formed. Accordingly, unlike Comparative Example 2, no leak currents flow between the n-type amorphous semiconductor layer 8 and the p-type crystalline semiconductor substrate 20 which have respectively the opposite conductive types.

For this reason, as described previously, the photovoltaic device of Example 2 is considered to possess the superior characteristics to those of the photovoltaic device of Comparative Example 2.

Therefore, irrespective of whether the single-crystal substrate is of the n-type or of the p-type, it is possible to manufacture a photovoltaic device having excellent output characteristics by irradiating the laser beam from the side where the amorphous semiconductor layer having the same conductive time as that of the single-crystal substrate, that is, from the main surface side provided opposite side of the main surface on which the amorphous semiconductor layer having the different conductive type from that of the single-crystal substrate is formed, and thereby forming the trenches on the structure, the trench not reaching the amorphous semiconductor layer having the different conductive type from that of the single-crystal substrate.

The crystalline semiconductor substrate may be a single-crystal silicon substrate, a polycrystalline silicon substrate. Moreover, the present invention is applicable not only to the silicon substrate but also to other semiconductor substrates such as a germanium substrate. The amorphous semiconductor layers may be an amorphous germanium layers.

As described above, according to the present invention, it is possible to provide a technique for manufacturing a photovoltaic device in a desired size having a heterojunction formed by combining an amorphous semiconductor and a crystalline semiconductor while suppressing reductions in the open voltage Voc and the fill factor F. F.

Third Embodiment

Hereinafter, third embodiment of the present invention will be described with reference to drawings.

Figure 13:
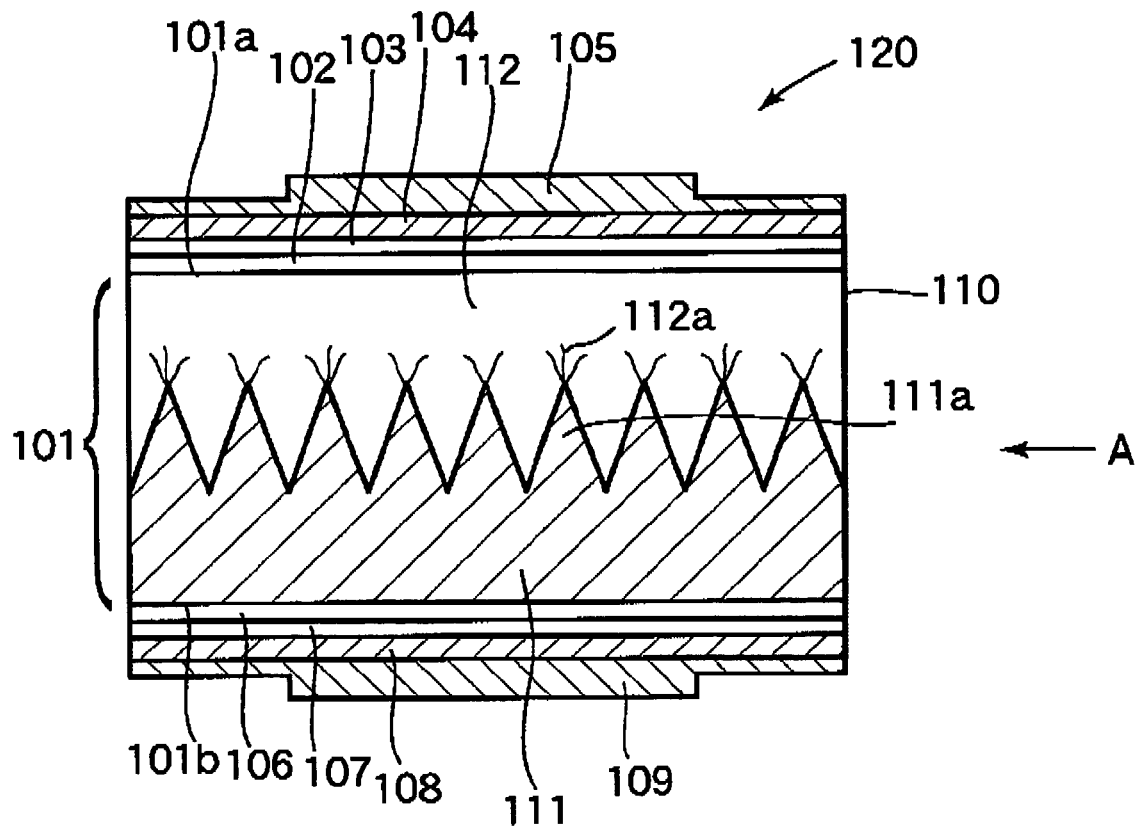
FIG. 13 is a side view of a photovoltaic device of a third embodiment according to the present invention.
Figure 14:
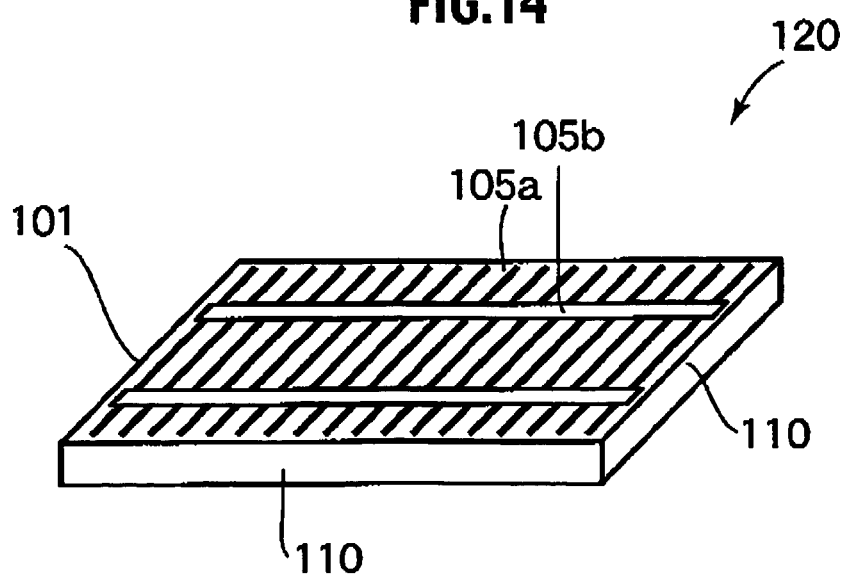
FIG. 14 is a perspective view of the photovoltaic device of the third embodiment according to the present invention.

FIG. 13 is a side view showing a photovoltaic device of a third embodiment according to the present invention. FIG. 14 is a perspective view showing the photovoltaic device shown in FIG. 13. The photovoltaic device shown in FIGS. 13 and 14 is fabricated by separating fringes of a substrate of the photovoltaic device from the substrate by use of a cutting lines 114 as show in FIG. 16.

As shown in FIG. 13, the photovoltaic device of the third embodiment has the following structure. A substantially intrinsic amorphous semiconductor layer 102 with a thickness of 5 nm is formed on a one main surface 101a of the (100) plane provided in an n-type crystalline semiconductor substrate 101 having the one main surface 101a. On the intrinsic amorphous semiconductor layer 102, a p-type amorphous semiconductor layer 103 having a thickness of 5 nm is formed. Further, on the p-type amorphous semiconductor layer 103, a p-side transparent conductive film layer 104 having a thickness of approximately 80 nm to 100 nm is formed. On the p-side transparent conductive film layer 104, a p-side collector electrode 105 formed of an ITO (indium tin oxide) film is formed. The ITO film is made of $InO_2$ containing approximately 5 percent by mass of $SnO_2$. As shown in FIG. 14, the p-side collector electrode 105 is configured of a plurality of finger electrodes 105a and bus bar electrodes 105b. The finger electrodes 105a are formed with predetermined intervals to extend in parallel. The bus bar electrodes 105b further collect electric currents which have been collected by the finger electrodes 105a.

Further, on the other main surface 101b (back surface) of the n-type crystalline semiconductor substrate 101, a substantially intrinsic intrinsic amorphous semiconductor layer 106 having a thickness of approximately 5 nm is formed. On the intrinsic amorphous semiconductor layer 106, an n-type amorphous semiconductor layer 107 having a thickness of approximately 5 nm is formed. Furthermore, on the n-type amorphous semiconductor layer 107, a n-side transparent conductive film layer 108 having a thickness of approximately 80 nm to 100 nm is formed. On the n-side transparent conductive film layer 108, a n-side collector electrode 109 configured of finger electrodes and bus bar electrodes is formed as in the case of the p-side collector electrode 105.

As described above, a photovoltaic device 120 shown in FIG. 13 is formed by means of separating the fringes composed of four sides from the photovoltaic device 120 on the cutting lines 114 shown in FIG. 14. By separation of the fringes on the cutting lines 114, four separate processed side surfaces 110 are formed as shown in FIG. 14.

As shown in FIG. 13, on the separate processed side surface 110, a laser processed region 111 and a cut processed region 112 are formed. The laser processed region 111 extends from the other surface 101b to the one main surface 101a. The cut processed region 112 extends from the one main surface 101a to the other main surface 101b. Note that the laser processed region 111 and the cut processed region 112 of the separate processed side surface 110 are magnified in FIG. 13.

As shown in FIG. 13, a large number of convex portions 111a extending toward the main surface 101a are formed at the boundary between the laser processed region 111 and the cut processed region 112. Because of the convex portions 111a, irregularities are formed at the boundary. The convex portions 111a are formed when the laser processed region 111 is formed.

Figure 15:
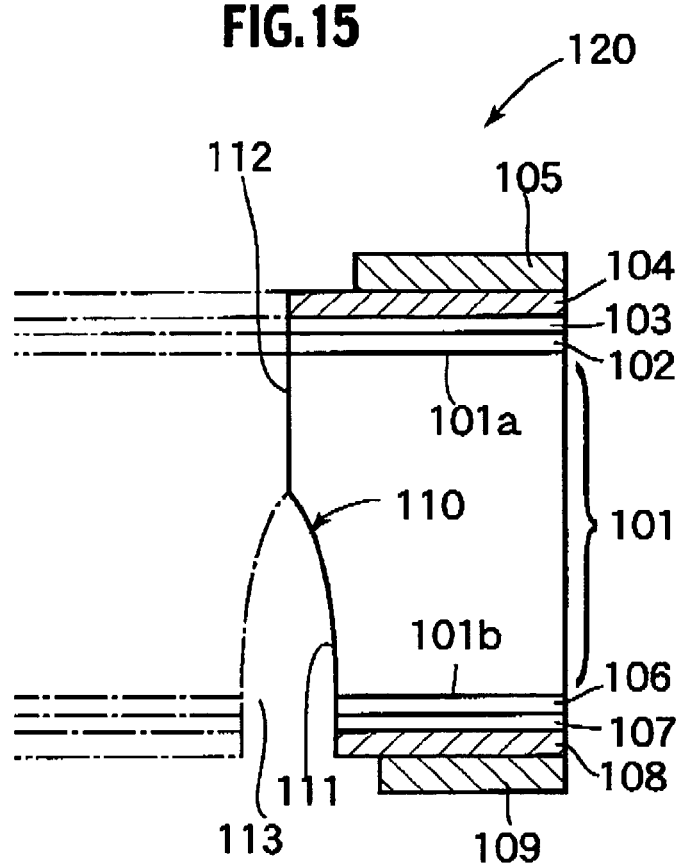
FIG. 15 is a side view showing the state of the photovoltaic device of the third embodiment according to the present invention when separation process is performed, the photovoltaic device viewed from the direction indicated by an arrow A in FIG. 13.
Figure 17:
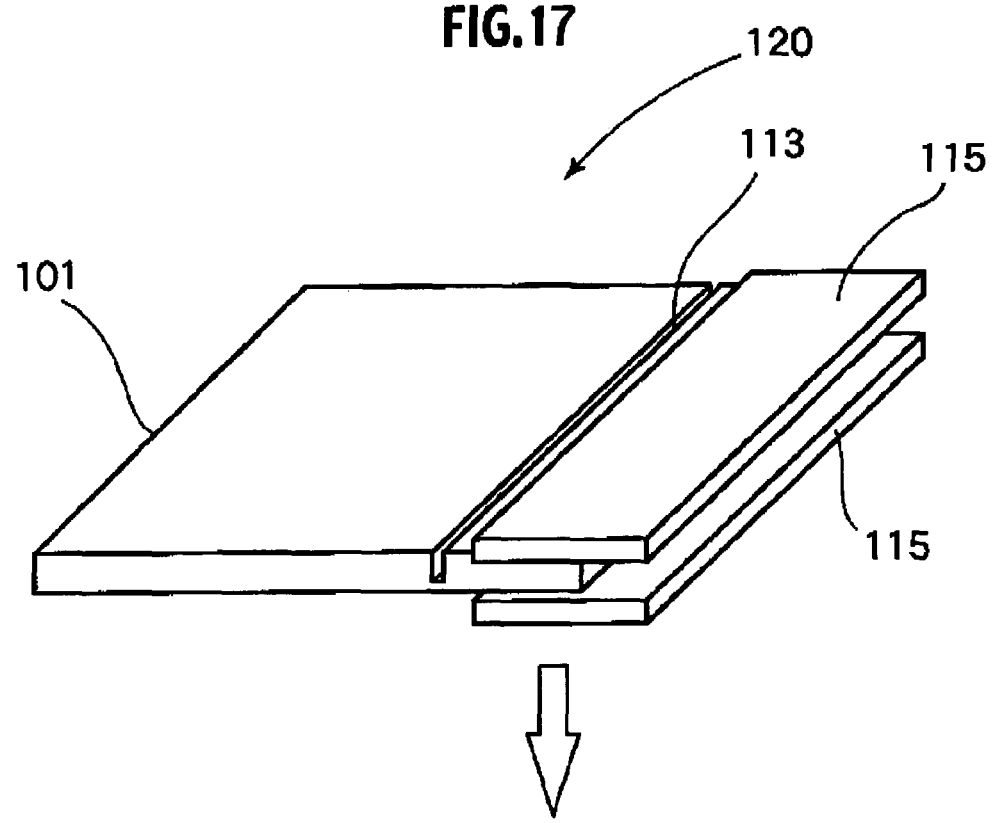
FIG. 17 is a perspective view showing a state where bend-cutting process is performed in the third embodiment according to the present invention.

FIG. 15 is a side view for describing a process of forming the laser processed region. FIG. 15 shows the photovoltaic device viewed from the direction indicated by the arrow A shown in FIG. 13. In FIG. 15, a portion indicated by the dashed lines shows the fringes of the photovoltaic device 120. The fringes are removed by performing laser process, and bend-cutting process from the substrate. As shown in FIG. 15, a laser beam is applied to the substrate from the other main surface 101b side of the n-type crystalline semiconductor substrate 101 to form a trench 113. When this trench 113 is formed, the laser processed region 111 is formed in a portion on the separate processed side surface 110 inside the trench 113. The bend-cutting process can be performed in the following manner. First, the trench 113 is previously formed in the above manner. Thereafter, as shown in FIG. 17, the fringe of the photovoltaic device 120 is interposed between holding members 115 and is bent using a portion corresponding to the trench 113 as the bending line. Accordingly, a cross section formed during the bend-cutting process serves as the cut processed region 112 as shown in FIG. 15.

Stress concentrated marks 112a shown in FIG. 13 are formed by the concentration of stresses when the bend-cutting process is performed. The stress concentrated marks 112a are formed 12 around the convex portions 111a in the cut processed region.

According to the present invention, when the bend-cutting process is performed, stresses are concentrated, as described above, on top of the convex portions 111a in the laser processed region 111 and on the peripheral portions thereof. Accordingly, the radial stress concentrated marks 112a extending from the convex portions 111a are formed. It is possible to perform the bend-cutting process easily since the large number of convex portions 111a are formed in the laser processed region 111, and stresses are concentrated on the top of the convex portions 111a and on the peripheral portions thereof when the bend-cutting process is performed. In other words, the bend-cutting process can be performed with small stresses. Since the fringe can be separated from the substrate with small stresses during the bend-cutting process, it is possible to reduce distortion to be caused at that time. As a result, a fill factor can be increased, and it becomes possible to obtain high photoelectric conversion efficiency.

Figure 18:
FIG. 18 is a microscope photograph showing a side surface of the photovoltaic device of the third embodiment according to the present invention.
Figure 19:
FIG. 19 is a microscope photograph showing a side surface of a photovoltaic device of a Comparative Example 3.
Figure 20:
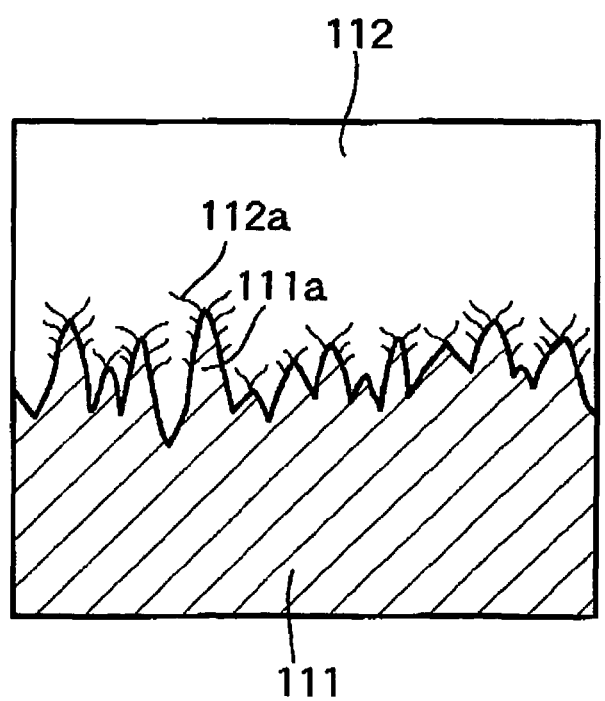
FIG. 20 is a side view corresponding to the microscope photograph in FIG. 18.
Figure 21:
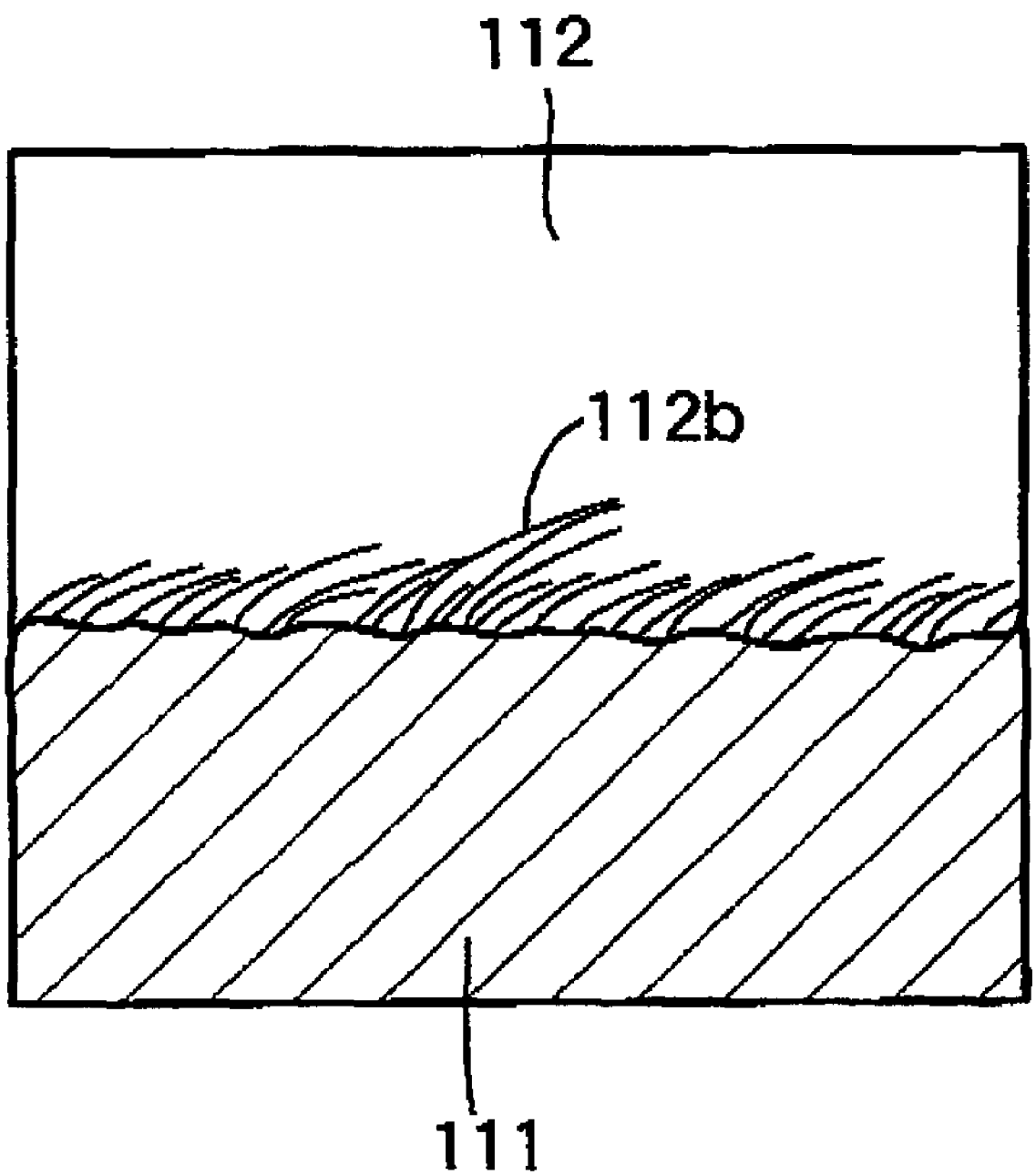
FIG. 21 is a side view corresponding to the microscope photograph in FIG. 19.

FIG. 18 is a microscope photograph showing the side surface of the photovoltaic device of a third embodiment according to the present invention. FIG. 19 is a microscope photograph showing a side surface of a photovoltaic device of a Comparative Example 3. In addition, FIG. 20 is a diagram corresponding to the FIG. 18 and shows the side surface of the photovoltaic device of the third embodiment of the present invention. FIG. 21 is a diagram corresponding to FIG. 19 and shows the side surface of the photovoltaic device of the Comparative Example 3.

As shown in FIGS. 18 and 20, on the side surface of the photovoltaic device according to the present invention, the convex portions 111a are formed in the top of the laser processed region 111. In the cut processed region 112 around the convex portions 111a, the radial stress concentrated marks 112a extending from the convex portions 111a are formed. It is considered that, since stresses are concentrated on the convex portions 111a during the bend-cutting process, the radial stress concentrated marks 112a extending from the convex portions 111a are formed.

On the other hand, in the photovoltaic device of the Comparative Example, no convex portions are formed in the laser processed region 111 as shown in FIGS. 19 and 21. If the bend-cutting process is performed in such a state, a large stress is applied to the cut processed region 112 and a fringe of a substrate of the photovoltaic device is separated while being twisted. For this reason, cracks 112b extending toward a certain direction are observed.

FIG. 22 is a side view for describing a relation between laser irradiation conditions for laser process and shapes of the top of the laser processed region. A laser beam output, a laser pulse frequency and a laser scanning speed, and the number of scanning times of laser irradiation can be taken as examples of the laser irradiation conditions which influence the shape of the laser processed region.

The depth of the laser processed region, in other words the depth of the trench formed by means of the laser process, has a proportional relationship with the output. Accordingly, it is possible to increase the depth by increasing the output.

Figure 22A:
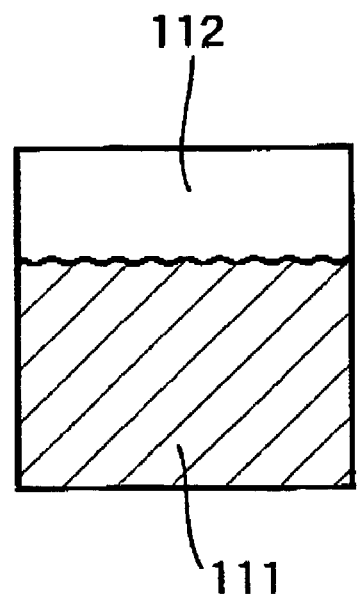
FIG. 22A to 22C are side views showing influences on a shape of laser process region by pulse frequency and scanning speed when laser irradiation is performed.

The pulse frequency and the scanning speed have the largest influence on the shapes of the convex regions in the laser processed region. The larger the value obtained by dividing a value of a pulse frequency by a value of a scanning speed is, the narrower intervals between the convex portions become. If the intervals between the convex portions are narrower than a certain width, the shape of the top of the laser processed region is so flat that the convex portions cannot be recognized by use of a microscope (at ×100 magnification). FIG. 22A shows such a shape.

On the other hand, there is a tendency that if the value obtained by dividing a value of a pulse frequency by a value of a scanning speed is smaller, the intervals between the convex portions tend to be wider and the heights of the convex portions to be lower. FIG. 22C shows such a shape.

Figure 22B:
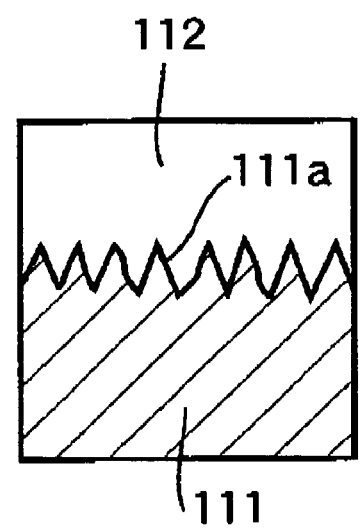
Figure 22C:
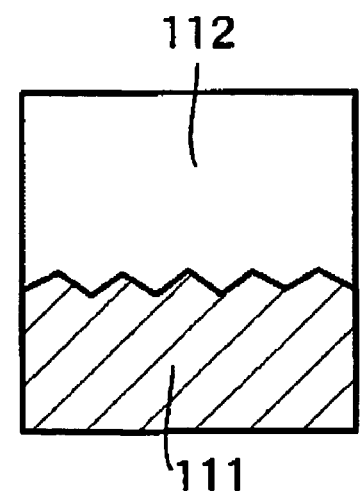

In order to form the convex portions 111a according to the present invention such as ones shown in FIG. 22B, it is necessary to control a pulse frequency and a scanning speed so that the value obtained by dividing a value of the pulse frequency by a value of the scanning speed is smaller than that in a case where such a shape as in FIG. 22A is shown, and is larger than that in a case where such a shape as in FIG. 22C is shown.

In addition, the number of scanning times of laser irradiation has a large influence on the depth of the trench. As the number of scanning times increases, the processed depth is increased. However, the rate of depth increase is gradually reduced.

Figure 23:
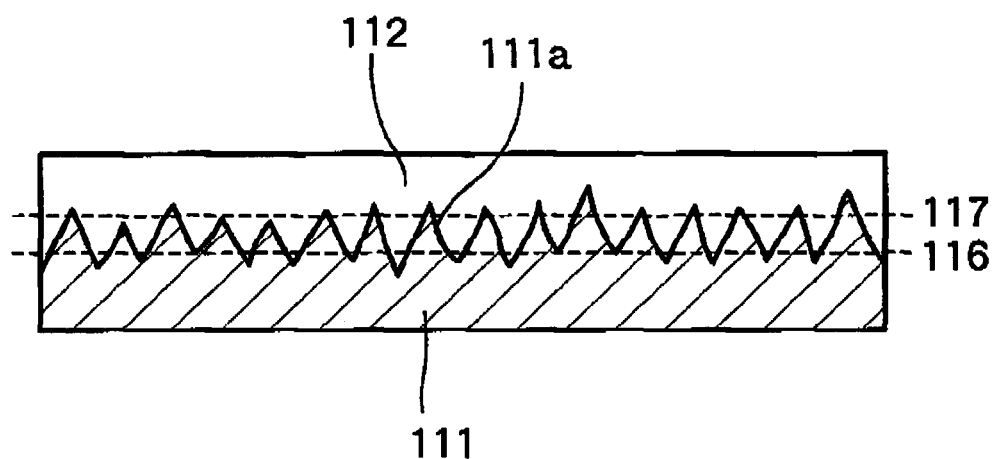
FIG. 23 is a side view for explaining a method of measuring an average height of convex portions of the laser processed region.

FIG. 23 is a side view for describing a method of measuring the heights of the convex portions according to the present invention. The heights of the convex portions 111a in the laser processed region 111 are measured in the following manner. By use of a microscope having a measurement function, the convex portions 111a are magnified to be at a ×100 magnification, for example, to measure the distance between the top of each of the convex portions and the bottom part of each of the convex portions. Since the shapes of the convex portions are irregular, a measuring line 117 is drawn in the center position of the top of the convex portions 111a, a measuring line 116 is drawn in the center position of the bottom parts, and the distance between the measuring line 116 and the measuring line 117 is considered as the average height of the convex portions 111a.

In addition, with respect to the intervals between the convex portions 111a, a microscope having a measurement function is used as in the above-described case. The convex portions are magnified to, for example, 200 times. Thereafter, with respect to six convex portions which can be visually recognized, each of the distances between the convex portions is measured. The average value of the distances is considered as the average interval of the convex portions.

According to the third embodiment of the present invention, the convex portions 111a, extending toward the one main surface 101a of the n-type crystalline semiconductor substrate 101, are formed in the laser processed region 111. Therefore, since the stress generated at the bending and separating process is concentrated to the convex portion 111a and strain is dispersed, the strain of the separate processed side surface 110 is reduced. As a result, photovoltaic efficiency of the photovoltaic device 120 is improved.

Example 3

Hereinafter, descriptions will be provided for Example 3 in which the photovoltaic device according to the third embodiment of the present invention is manufactured.

[First Experiment]

<Fabrication of Photovoltaic Device Before Separation Process>

With respect to FIG. 13, impurities were removed by cleansing the n-type crystalline semiconductor substrate 101 having the (100) plane. The n-type crystalline semiconductor substrate 101 had a resistivity of approximately 1 Ω·cm and a thickness of approximately 300 μm.

Subsequently, the intrinsic amorphous semiconductor layer 102 and the p-type amorphous semiconductor layer 103, each of which layers had a thickness of approximately 5 nm, were sequentially formed on the one main surface 101a of the n-type crystalline semiconductor substrate 101. These layers were formed by means of a RF plasma CVD method under the conditions of a frequency of approximately 13.56 MHz; a forming temperature of approximately 100° C. to 300° C.; a reaction pressure of approximately 5 Pa to 100 Pa; and a RF power of approximately 1 mW/cm$^2$ to 500 mW/cm$^2$. Incidentally, B, Al, Ga or In which is the Group 3 element can be taken as an example of a p-type dopant used when the p-type amorphous semiconductor layer 103 is formed. Additionally, it is possible to form the p-type amorphous semiconductor layer 103 by mixing a material gas such as $SiH_4$ (silane) with a compound gas containing at least one of the above-mentioned p-type dopants when the p-type amorphous semiconductor layer 103 is formed.

Subsequently, as in the above-mentioned case, the intrinsic amorphous semiconductor layer 106 and the n-type amorphous semiconductor layer 107, each of which layers had a thickness of approximately 5 nm, were sequentially formed on the other main surface 101b of the n-type crystalline semiconductor substrate 101. Note that P, N, As or Sb which is the Group 5 element can be taken as an example of a n-type dopant used when the n-type amorphous semiconductor layer 107 is formed. It is possible to form the n-type amorphous semiconductor layer 107 by mixing a material gas with a compound gas containing at least one of the above-mentioned n-type dopants when the n-type amorphous semiconductor layer 107 is formed.

Next, by means of a sputtering method, the p-side transparent conductive film layer 104 and n-side transparent conductive film layer 108 formed of ITO films were respectively formed on the p-type amorphous semiconductor layer 103 and the n-type amorphous semiconductor layer 107. Each of the p-side transparent conductive film layer 4 and n-side transparent conductive film layer 108 can be formed by use of the sputtering method using a target formed of a sintered body of $In_2O_3$ powders containing approximately 5 percent by weight of $SnO_2$ powders. By changing the amount of $SnO_2$ powders, it is made possible to change the amount of Sn in an ITO film. The amount of Sn to the amount of In is preferably approximately 1 percent by mass to 10 percent by mass. Each of the transparent conductive films 4 and 8 is formed in a thickness of approximately 80 nm to 100 nm.

After that, an epoxy thermosetting conductive paste (silver (Ag) paste) was transferred onto a predetermined region of the transparent electrode 4 on the one main surface 101a side by means of a screen printing method. Thereafter, the conductive paste was heated in a heating furnace to be hardened.

Accordingly, the p-side collector electrode 105 was formed. The n-side collector electrode 109 was also formed in the similar manner.

<Trench Formation by Laser Process>

Figure 16:
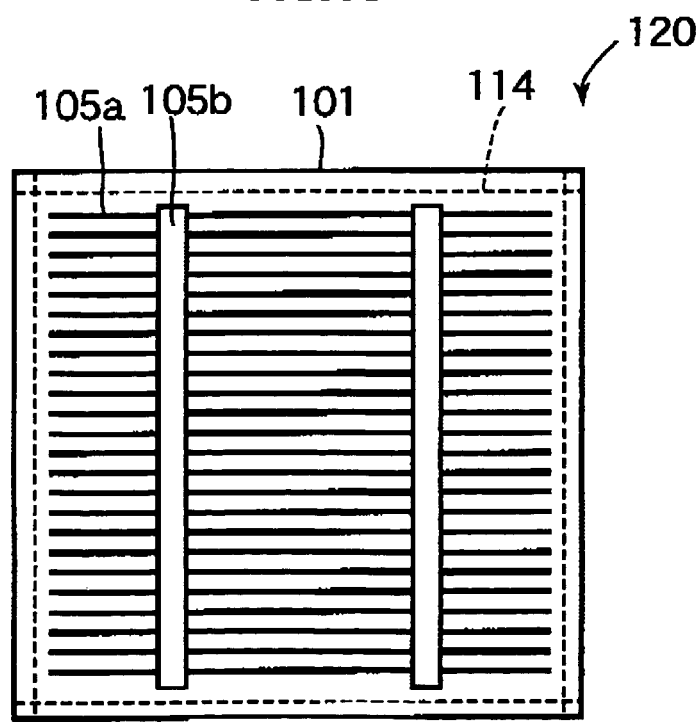
FIG. 16 is a plan view showing a part, which corresponds to fringes to be separated, of the photovoltaic device of the third embodiment according to the present invention.

By laser process, the trenches were formed in the fringes of the photovoltaic device fabricated as described above. As shown in FIG. 16, the trenches were respectively formed in the four parts in the fringes, the parts being shown by dashed lines (cutting lines 114). A YAG laser beam was used as a laser beam, and the YAG laser beam was applied to the fringes from the other main surface 101b side of the n-type crystalline semiconductor substrate 101. The laser beam was controlled to be in a range of an output of 3 W to 10 W, a wavelength of 1064 nm, and a pulse frequency of 1 kHz to 30 kHz. Scanning was performed at a constant laser scanning speed in a range of 1 to 30 nm per second. The number of the scanning times was selected from a range of once to six times.

Under the above-described laser irradiation conditions, laser beams were applied so that average heights of convex parts of photovoltaic devices were respectively 7 µm, 15 µm, 25 µm, 50 µm, and 75 µm. Additionally, the convex portions were formed so that the average interval between the convex portions in each of the cases was in a range of 0.2 to 3.0 times each of the average heights of the convex portions. In addition, the convex portions were formed so that, with respect to each of the photovoltaic devices, the average of heights from the other main surface to the top of the convex portions was within a range of 150 µm to 200 µm.

<Bend-Cutting Process of Photovoltaic Device>

Five photovoltaic devices were obtained in the above-described manner. With respect to each of the photovoltaic devices, bend-cutting process was performed by bending the fringes thereof by using the formed trench as the bending line. Accordingly, each of the photovoltaic devices was prepared.

[Characteristics Evaluation of Photovoltaic Device]

Figure 24:
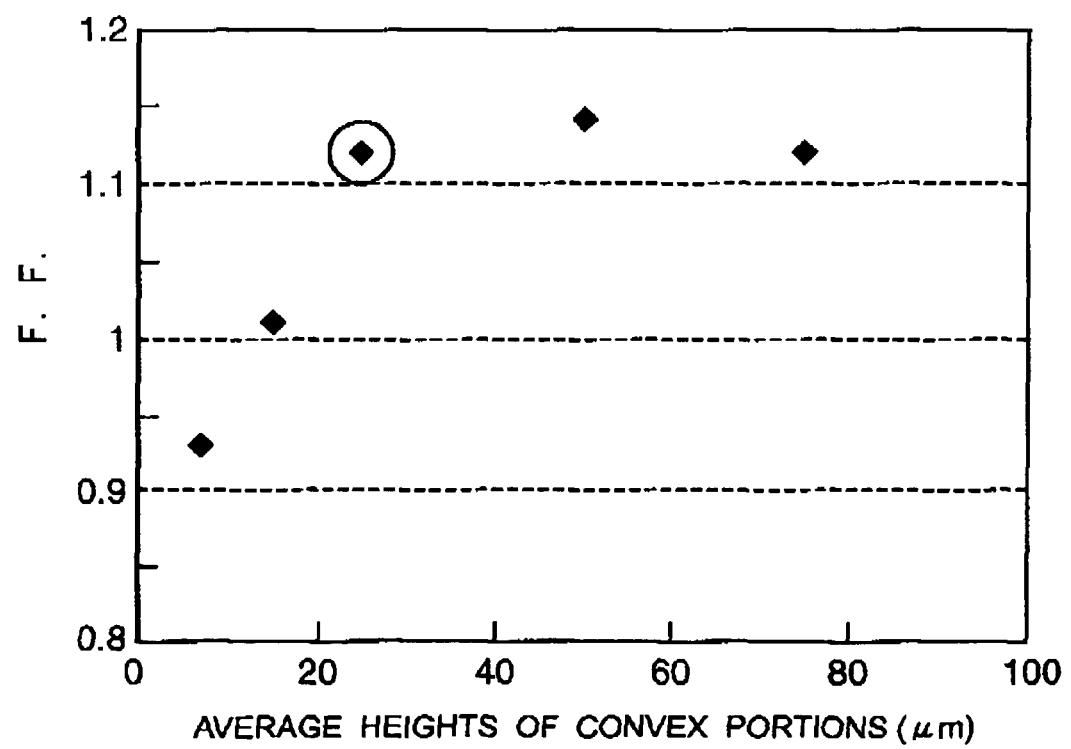
FIG. 24 is a chart showing a relation between a standardized fill factor and the average height of the convex portions of the laser processed region.

A beam of light of solar simulator of AM 1.5 and 1 kW/m$^2$ was applied to each of the five types of photovoltaic devices prepared in the above manner, and I-V characteristics thereof were measured. FIG. 24 shows the measurement results. The horizontal axis indicates the average heights of the convex portions, and the vertical axis indicates the fill factors (F.F). Note that values of fill factor shown therein are values standardized based on the fill factor of the photovoltaic device of the Comparative Example 3. A photovoltaic device in which no separation process is performed on fringes thereof was used as the photovoltaic device of the Comparative Example 3.

As clear from FIG. 24, with respect to the photovoltaic device having convex portions of which the average height is equal to or more than 15 µm, the value of the standardized F.F. is equal to or more than 1. In addition, the value of the standardized F.F increases as long as the average height of convex portions is less than 25 µm. A similar value of the standardized F.F. is maintained when the average height of convex portions is equal to or more than 25 µm. Accordingly, it is understood that an average height of convex portions is preferably equal to or more than 15 µm.

[Second Experiment]

Photovoltaic devices were fabricated as in the case of the first experiment except trench formations which were performed in a manner as described below.

Eight types of photovoltaic devices were prepared so that, with respect to each of the photovoltaic devices, an average height of convex portions was within a range of 25 to 30 µm. Each of the eight photovoltaic devices had a different average height from the other main surface to top of the convex portions. The average heights were respectively 60 µm, 90 µm, 120 µm, 150 µm, 200 µm, 250 µm, 270 µm, and 300 µm. Additionally, photovoltaic devices were prepared so that, with respect to each of the photovoltaic devices, the average interval between the convex portions is within a range of 0.2 to 3.0 times the average height of the convex portions.

[Characteristics Evaluation of Photovoltaic Device]

Figure 25:
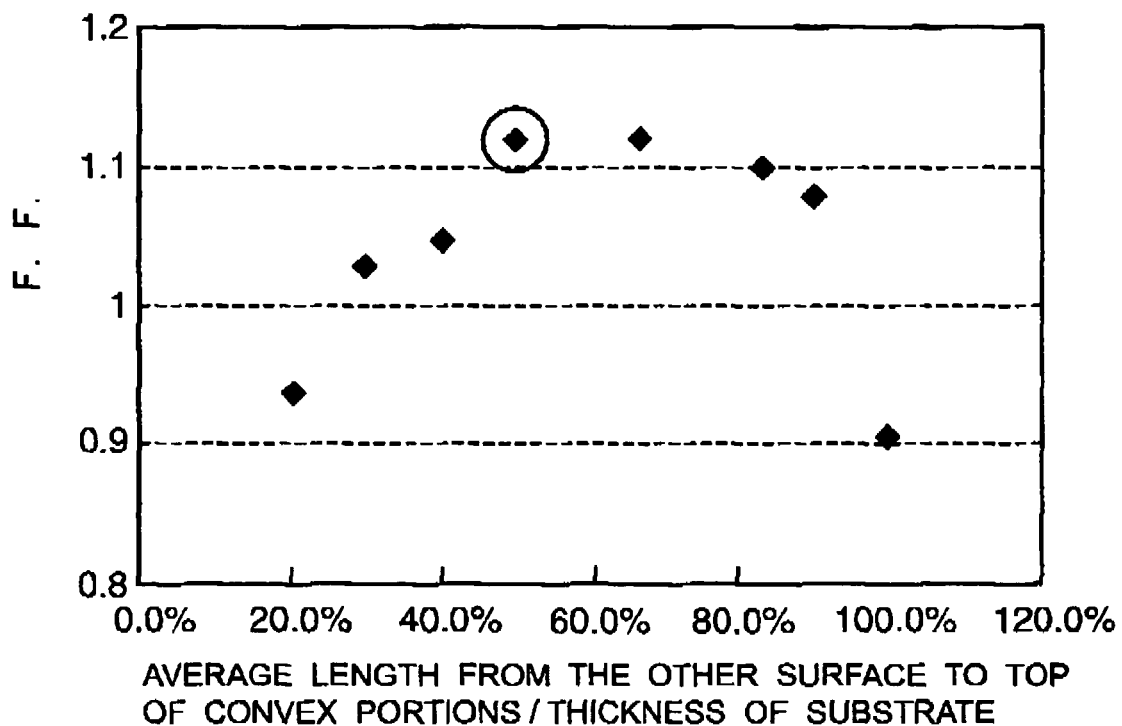
FIG. 25 is a chart showing a relation between a standardized fill factor and a value obtained by dividing the value of an average of length from the other main surface to top of the convex portions by a value of a thickness of the substrate.

As in the case of the first experiment, I-V characteristics were measured with respect to each of the eight types of photovoltaic devices fabricated as described above. FIG. 25 shows the measurement results. Note that "the horizontal axis indicates values, each of which is obtained by dividing a value of an average length from the other main surface to top of convex portions by a value of a thickness of a substrate" in FIG. 25. Accordingly, the value becomes 100% in a case of a photovoltaic device in which an average length from the other main surface to top of convex portions is 300 µm since a substrate has a thickness of 300 µm. In addition, the points circled in FIGS. 24 and 25 show the measurement results of the same device.

As shown in FIG. 25, when an average length from the other main surface to the top of the convex portions is equal to or more than 30% of a thickness of a substrate, a standardized F.F. becomes higher than 1. When an average length is equal to or more than 30% and is less than 50% of a thickness of a substrate, a standardized fill factor increases in accordance with an increase in the distance from the other main surface to the top of the convex portions. With respect to photovoltaic devices in each of which an average length is equal to or more than 50% of a thickness of a substrate, values of standardized fill factors are substantially maintained at a certain level. Accordingly, it is understood that an average length from the other main surface to the top of the convex portions is more preferably equal to or more than 50% of the thickness of a substrate. In addition, with respect to photovoltaic device in which an average length is equal to or more than 90% of a thickness of a substrate, a standardized fill factor is less than 1. For this reason, it is understood that the standardized fill factor is equal to or more than 1 if the average length from the other main surface to the top of the convex portions is in a range of 30% to 90% of the thickness of a substrate. It is also understood that an average length is more preferably in a range of 50% to 90% of the thickness of a substrate.

Note that, in FIG. 25, with respect to a photovoltaic device in which an average length is 100% of the thickness of a substrate, the top of the convex portions thereof reach the one main surface of the substrate. It is understood that if the top of the convex portions reach the one main surface, a standardized fill factor significantly decreases. Accordingly, the average length from the other main surface to the top of the convex portions is preferably less than 100% of the thickness of a substrate.

In each of the foregoing embodiments, the descriptions have been provided for the case where the four sides in the fringes of the photovoltaic device are separated. However, note that the present invention is not limited to this, and the present invention is also applicable to cases in each of which only one side is separated or only two or three sides are separated.

Figure 26:
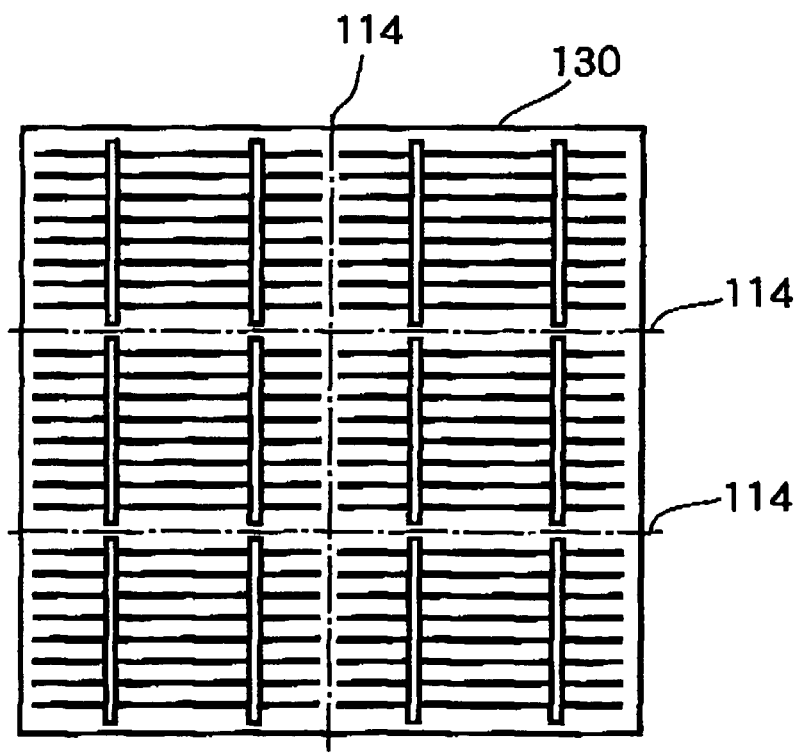
FIG. 26 is a plan view for explaining another embodiment according to the present invention.
Figure 27:
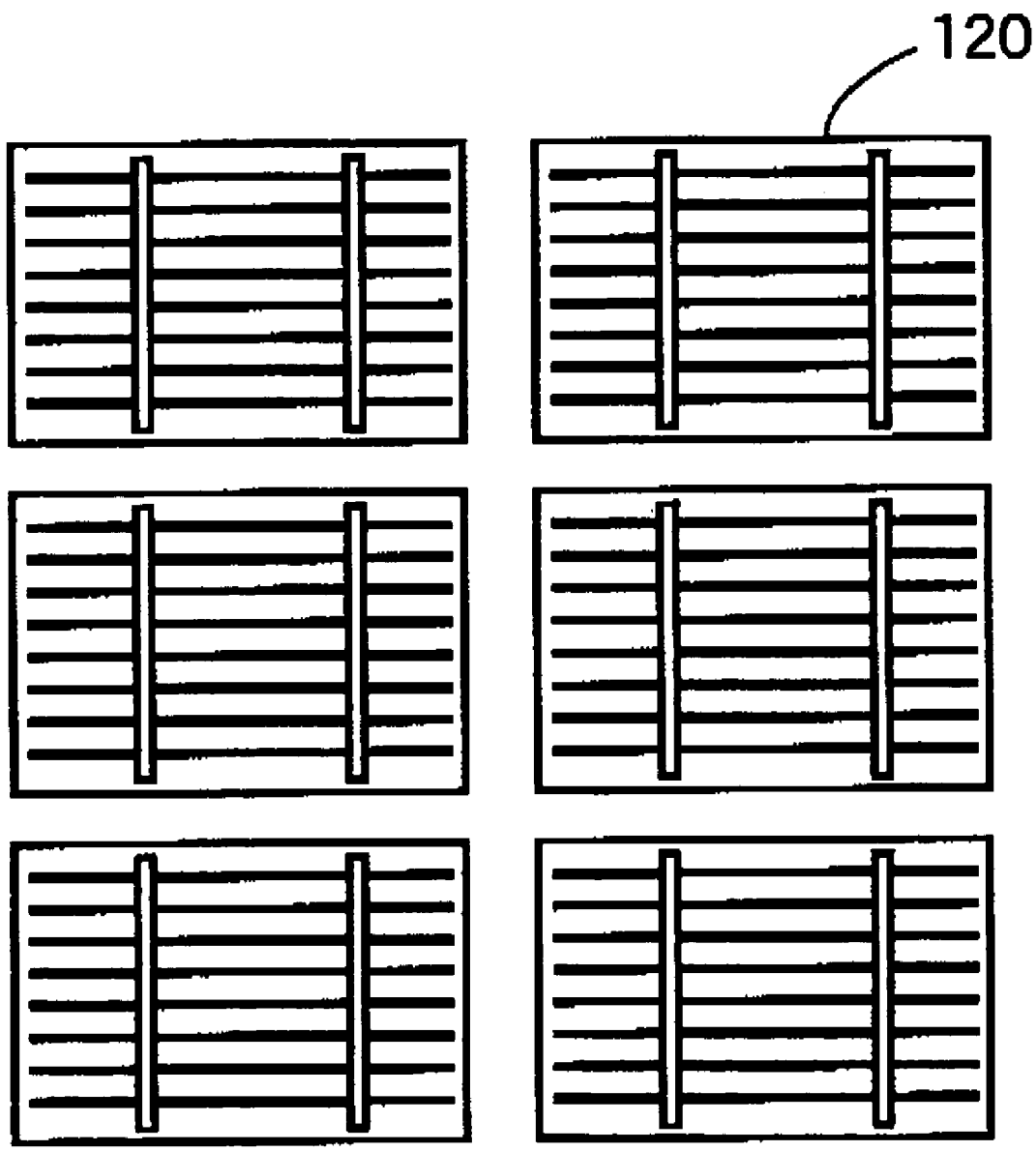
FIG. 27 is a plan view for explaining another embodiment according to the present invention.

The present invention is also applicable to a case where small-sized photovoltaic devices 120 are manufactured by dividing one plate of photovoltaic device array 130 into a plurality of plates by use of a part indicated by the dashed line (cutting lines 114) as shown in FIG. 26. Additionally, separation is not limited to the separation along a straight line. The present invention is also applicable to a case where separation is done along a curve.

Further, in each of the foregoing embodiments, the descriptions have been provided taking the photovoltaic device of the HIT structure as an example. However, the present invention is applicable to photovoltaic devices each using a crystalline semiconductor substrate and also to other photovoltaic devices. For example, the present invention can be also applied to thin film solar cells each of which is formed on a monocrystalline silicon substrate, a polysilicon substrate, a compound semiconductor substrate or a crystalline substrate, and the like.

In addition, in each of the foregoing embodiments, an epoxy thermosetting conductive paste was used as a material for the collector electrode. However, the present invention is not limited to this. A conductive material containing a resin material other than epoxy resin materials may be used as a material for a bonding layer, the bus bar electrodes and the back surface electrode. Alternatively, a conductive paste containing a polyester, acrylic, polyvinyl or phenolic resin material, or the like, may be used.

Additionally, in each of the forgoing embodiments, each of the collector electrodes is formed by heating and hardening the conductive paste. However, the present invention is not limited to this. The collector electrode may be formed by a method other than the one described above. For example, the collector electrode may be formed by depositing Al or the like, or by bonding a metal wire with a bonding layer.

Further, in each of the foregoing embodiments, the back surface electrode is formed on the conductive film on the other main surface side, the back surface electrode formed of the bus bar electrodes and the finger electrodes. However, the present invention is not limited to this. It does not matter to form the back surface electrode covering the entire transparent conductive film of the other main surface side.

Furthermore, in each of the foregoing embodiments, silicon (Si) was used as a semiconductor material. However, the present invention is not limited to this. It is also possible to use any one semiconductor selected from SiGe, SiGeC, SiC, SiN, SiGeN, SiSn, SiSnN, SiSnO, SiO, Ge, GeC and GeN. In this case, each of these semiconductors may be crystalline one, amorphous one containing at least any of hydrogen and fluorine, or microcrystalline one.

Still further, in each of the foregoing embodiments, an indium oxide doped with Sn (ITO) was used as a material to form the transparent conductive film. However, the present invention is not limited to this. A transparent conductive film formed of a material other than an ITO film may be used. For example, a transparent conductive film may be formed of indium oxide with which at least any one of Zn, As, Ca, Cu, F, Ge, Mg, S, Si and Te is mixed.

Yet further, in each of the foregoing embodiments, the amorphous semiconductor layer was formed by use of the RF plasma CVD method. However, the present invention is not limited to this. The amorphous semiconductor layer may be formed by means of another method such as a deposition method, sputtering method, a microwave plasma CVD method, an ECR method, a thermal CVD method or a LPCVD method (a low-pressure CVD method).

The present invention has been described with reference to certain embodiments. It is to be noted, however, that the foregoing embodiments are merely examples. It is obvious to those skilled in the art that various modified examples are possible in terms of combinations of the respective constituents and the respective processes, and that those modified examples are encompassed by the scope of the present invention as defined in the appended claims.

What is claimed is:

1. A photovoltaic device comprising
   a crystalline semiconductor substrate of first conductive type including a first main surface and a second main surface provided on an opposite side of the first main surface, and
   a semiconductor layer of second conductive type provided on the first main surface, wherein,
   the crystalline semiconductor substrate and the semiconductor layer include a processed side interposed between the first main surface and the second main surface,
   the processed side surface including a thermally influenced laser processed region and a bent and cut processed region,
   wherein the thermally influenced laser processed region is disposed along a side surface of the second main surface of the crystalline semiconductor substrate and extends from the second main surface toward the first main surface and terminates prior to intersecting the semiconductor layer of second conductive type, the laser processed region comprising a plurality of convex portions extending toward the first main surface on a boundary between the thermally influenced laser processed region and the cut processed region, and,
   the bent and cut processed region is disposed along a side surface proximate the first main surface of the crystalline semiconductor substrate and a side surface of the semiconductor layer and includes a plurality of stress concentrated marks formed radially from the convex portions of the thermally influenced laser processed region.

2. A photovoltaic device according to claim 1, wherein,
   the semiconductor layer of the second conductive type comprises an amorphous semiconductor layer of the second conductive type and a conductive film layer of the second conductive type that are layered in order from the first main surface of the crystalline semiconductor substrate.

3. A photovoltaic device according to claim 2 further comprising;
   a semiconductor layer of the first conductive type provided on the second main surface of the crystalline semiconductor substrate, wherein,
   the semiconductor layer of the first conductive type comprises an amorphous semiconductor layer of the first conductive type and a conductive film layer of the first conductive type that are layered in order from the second main surface of the crystalline semiconductor substrate.

4. A photovoltaic device according to claim 3, wherein,
   at least one of the amorphous semiconductor layer of the second conductive type and the amorphous semiconductor layer of the first conductive type includes an intrinsic amorphous semiconductor layer.

5. A photovoltaic device according to claim 1, further comprising a cut-processed region wherein,
   the cut processed region is formed by a bending and cutting process,
   the thermally influenced laser processed region has a plurality of convex portions extending toward the first main surface on a the boundary between the thermally influenced laser processed region and the cut processed region, and,
   the cut processed region has a stress concentrated marks formed radially from the convex portions of the thermally influenced laser processed region, which marks are generated during a the bending and cutting process.

6. A photovoltaic device according to claim 5, wherein, an average height of the convex portions is equal to or more than 15 μm.

7. A photovoltaic device according to claim 5, wherein, an average interval between the convex portions is 0.2 to 3.0 times an average height of the convex portions.

8. A photovoltaic device according to claim 5, wherein, an average length from the second main surface to top of the convex portions is equal to or more than 50% of a length from the second main surface to the first main surface.

9. A photovoltaic device comprising
a crystalline semiconductor substrate of first conductive type including a first main surface and a second main surface provided on an opposite side of the first main surface, and
a semiconductor layer of second conductive type provided on the first main surface, wherein,
the crystalline semiconductor substrate and the semiconductor layer include a processed side interposed between the first main surface and the second main surface,
the processed side surface including a thermally influenced laser processed region,
wherein the thermally influenced laser processed region is disposed along a side surface of the second main surface of the crystalline semiconductor substrate and extends from the second main surface toward the first main surface and terminates prior to intersecting the semiconductor layer of second conductive type, the laser processed region comprising a plurality of convex portions extending toward the first main surface on a boundary between the thermally influenced laser processed region and a bent and cut processed region.

10. The photovoltaic device of claim 9, wherein the thermally influenced laser processed region comprises a microcrystallized surface.

11. The photovoltaic device of claim 9, further comprising a cut-processed region wherein,
the thermally influenced laser processed region has a plurality of convex portions extending toward the first main surface on a boundary between the thermally influenced laser processed region and the cut processed region, and,
the cut processed region has a stress concentrated marks formed radially from the convex portions of the thermally influenced laser processed regions.

12. A photovoltaic device comprising
a crystalline semiconductor substrate of first conductive type including a first main surface and a second main surface provided on an opposite side of the first main surface, and
a semiconductor layer of second conductive type provided on the first main surface, wherein,
the crystalline semiconductor substrate and the semiconductor layer include a processed side interposed between the first main surface and the second main surface,
the processed side surface including a thermally influenced region formed by laser beam irradiation, and a bent and cut processed region,
wherein the thermally influenced region is disposed along a side surface of the second main surface of the crystalline semiconductor substrate and extends from the second main surface toward the first main surface and terminates prior to intersecting the semiconductor layer of second conductive type, the thermally influenced side surface being microcrystallized by the influence of heat from laser processing and including a plurality of convex portions extending toward the first main surface,
the bent and cut processed region is disposed along a side surface proximate the first main surface of the crystalline semiconductor substrate and a side surface of the semiconductor layer and includes a plurality of stress concentrated marks formed radially from the convex portions of the thermally influenced laser processed region, the semiconductor layer of the second conductive type not being microcrystallized.

13. The photovoltaic device of claim 12 wherein the semiconductor layer of the second type is an amorphous semiconductor layer including impurities of the second conductive type.

14. A photovoltaic device comprising
a crystalline semiconductor substrate of first conductive type including a first main surface and a second main surface provided on an opposite side of the first main surface, and
a semiconductor layer of second conductive type provided on the first main surface, wherein,
the crystalline semiconductor substrate and the semiconductor layer include a processed side interposed between the first main surface and the second main surface,
the processed side surface including a thermally influenced laser processed region and a bent and cut processed region,
wherein the thermally influenced laser processed region is disposed along a side surface of the second main surface of the crystalline semiconductor substrate and extends from the second main surface toward the first main surface and terminates prior to intersecting the semiconductor layer of second conductive type, the thermally influenced side surface being microcrystallized by the influence of heat from laser processing and including a plurality of convex portions extending toward the first main surface such that a processed side surface corresponding to the semiconductor layer of the second conductive type is not microcrystallized.

15. The photovoltaic device of claim 14 wherein the semiconductor layer of the second type is an amorphous semiconductor layer including impurities of the second conductive type.

* * * * *